US008258604B2

(12) United States Patent
Bando et al.

(10) Patent No.: US 8,258,604 B2
(45) Date of Patent: Sep. 4, 2012

(54) SEMICONDUCTOR DEVICE AND METHOD OF MANUFACTURING SAME

(75) Inventors: Koji Bando, Tokyo (JP); Kazuyuki Misumi, Tokyo (JP); Tatsuhiko Akiyama, Tokyo (JP); Naoki Izumi, Tokyo (JP); Akira Yamazaki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 160 days.

(21) Appl. No.: 12/647,445

(22) Filed: Dec. 26, 2009

(65) Prior Publication Data

US 2010/0164077 A1    Jul. 1, 2010

(30) Foreign Application Priority Data

Dec. 26, 2008   (JP) ................................. 2008-333247

(51) Int. Cl.
*H01L 23/552* (2006.01)

(52) U.S. Cl. . 257/659; 257/421; 257/660; 257/E23.114; 257/E21.409; 257/294

(58) Field of Classification Search ........... 257/659–660
See application file for complete search history.

(56) References Cited

U.S. PATENT DOCUMENTS

| 5,440,169 | A | * | 8/1995 | Tomita et al. .................. 257/667 |
| 6,916,668 | B2 | * | 7/2005 | Spielberger et al. .............. 438/3 |
| 6,984,867 | B2 | | 1/2006 | Nakajima |
| 7,336,556 | B2 | | 2/2008 | Okayama et al. |

FOREIGN PATENT DOCUMENTS

| JP | 2003-115578 A | 4/2003 |
| JP | 2003-309196 A | 10/2003 |
| JP | 2004-047656 A | 2/2004 |
| JP | 2004-103071 A | 4/2004 |
| JP | 2004-193247 A | 7/2004 |
| JP | 2004-221463 A | 8/2004 |

* cited by examiner

*Primary Examiner* — Mamadou Diallo
(74) *Attorney, Agent, or Firm* — Miles & Stockbridge P.C.

(57) ABSTRACT

To provide a technique that can improve the data retention characteristic of an MRAM device by improving the resistance against an external magnetic field in a semiconductor device including the MRAM device.

A first magnetic shield material is disposed over a die pad via a first die attach film. Then, a semiconductor chip is mounted over the first magnetic shield material via a second die attach film. Furthermore, a second magnetic shield material is disposed over the semiconductor chip via a third die attach film. That is, the semiconductor chip is disposed so as to be sandwiched by the first magnetic shield material and the second magnetic shield material. At this time, while the planar area of the second magnetic shield material is smaller than that of the first magnetic shield material, the thickness of the second magnetic shield material is thicker than that of the first magnetic shield material.

11 Claims, 29 Drawing Sheets

SEMICONDUCTOR DEVICE AND METHOD OF MANUFACTURING SAME

CROSS-REFERENCE TO RELATED APPLICATION

The disclosure of Japanese Patent Application No. 2008-333247 filed on Dec. 26, 2008 including the specification, drawings and abstract is incorporated herein by reference in its entirety.

BACKGROUND OF THE INVENTION

The present invention relates to a semiconductor device and a method of manufacturing the same, and in particular, relates to a technique effectively applied to a semiconductor device including a plurality of magnetic memory elements and a method of manufacturing the same.

Japanese patent laid-open No. 2004-103071 (Patent Document 1) describes a technique related to a magnetic memory device that is unlikely to be affected by a disturbing magnetic field. Specifically, a magnetic guide comprising a high-permeability soft magnetic material is disposed at a location in contact with or immediately adjacent to a magnetic memory so as to reduce the effect of a disturbing magnetic field on the magnetic memory. In Patent Document 1, with regard to die bonding of the magnetic memory (semiconductor chip) over a lead frame, the lead frame comprises a high-permeability material and the semiconductor chip is mounted over this lead frame. Patent Document 1 describes a technique of forming the magnetic shield by coating also the surface of the semiconductor chip with a high-permeability material.

Japanese patent laid-open No. 2003-115578 (Patent Document 2) describes a technique of achieving a non-volatile memory capable of high speed recording/reproduction by protecting an MRAM (Magnetic Random Access Memory) from an external magnetic field and thereby preventing malfunctions due to the external magnetic field and improving the stability in recording/reproducing operations of a memory element. Specifically, Patent Document 2 describes a technique of forming a structure in which the MRAM chip is covered with an insulating layer and the periphery thereof is covered with a magnetic shield structure except an electrode pad portion serving as an interface with the outside.

Japanese patent laid-open No. 2004-193247 (Patent Document 3) describes a technique of magnetically shielding an MRAM element sufficiently even against a high external magnetic field. Here, it is described that magnetically shielding the MRAM element can guarantee the operations without any problem against an external magnetic field, and also can contribute to a reduction in size and weight of electronic appliances. Specifically, it is described that in the MRAM element comprising a TMR element, wherein a magnetization fixed layer whose magnetization direction is fixed and a recording layer whose magnetization direction is variable are laminated, the TMR element is magnetically shielded by a high-saturation magnetization material layer exhibiting a high saturation magnetization of 1.8 tesla (T) or more.

Japanese patent laid-open No. 2004-47656 (Patent Document 4) describes a technique of efficiently manufacturing an MRAM element having a sufficient magnetic shield effect against an external magnetic field. Specifically, it is described as follows. In the lower surface of a transistor portion on the element mounting surface side of the MRAM element and in the upper surface of a bit line opposite to the element mounting surface side, a first magnetic shield layer and a second magnetic shield layer are formed using a soft magnetic metal, respectively, and then a passivation film is formed over the second magnetic shield layer. This suppresses a penetrated magnetic flux from an external magnetic field to an inverting magnetic field strength of the MRAM element or less, thereby improving the reliability. Furthermore, by using the soft magnetic metal for the first magnetic shield layer and the second magnetic shield layer, these shield layers can be formed by sputtering. If this soft magnetic metal is used partially in common with target elements that form each layer of the MRAM element, the first magnetic shield layer and the second magnetic shield layer can be efficiently formed using the same sputtering apparatus as used in forming each layer of the MRAM element. According to Patent Document 4, a high-permeability magnetic shield is formed in both the front surface, in which an MRAM element is formed, and the rear surface of a semiconductor chip, and the resultant semiconductor chip can be mounted to a lead frame.

Japanese patent laid-open No. 2003-309196 (Patent Document 5) describes a technique of improving the record retention properties of an MRAM element. Specifically, in a magnetic shield package in which the MRAM element is sealed surrounded by a soft magnetic shield member, in low frequency magnetic fields a magnetic flux reaching the magnetic shield member propagates the inside of the magnetic shield member due to the contribution of a real part of the permeability thereof, and thereby changing the direction of the magnetic flux. Moreover, in high frequency magnetic fields, the magnetic flux is absorbed inside the magnetic shield member due to the contribution of an imaginary part of the permeability. Furthermore, the periphery of the MRAM element is surrounded by the magnetic shield member and the MRAM element is protected against magnetic fluxes from various directions. Accordingly, the effect of an external magnetic field on the MRAM element can be suppressed and the record retention reliability of the MRAM element can be improved.

Japanese patent laid-open No. 2004-221463 (Patent Document 6) describes a technique of magnetically shielding an MRAM element sufficiently even against a high external magnetic field and ensuring the operations without any problem against the an external magnetic field. Specifically, in the MRAM element comprising a TMR element wherein a magnetization fixed layer whose magnetization direction is fixed and a recording layer whose magnetization direction is variable are laminated, the TMR element is magnetically shielded by a magnetic shield layer. At this time, the magnetic shield layer comprises a laminated structure including at least two soft magnetic material layers, and this laminated structure includes a high-permeability material layer and a high-saturation magnetization material layer.

SUMMARY OF THE INVENTION

In recent years, an MRAM (Magnetic Random Access Memory) device has got attention as a new generation non-volatile memory device. The MRAM device is a non-volatile memory device, wherein data is stored non-volatilely using a plurality of memory cells formed in a semiconductor integrated circuit and the respective memory cells can be randomly accessed.

Usually, the memory cell of the MRAM device (magnetic memory element) includes a magnetoresistive element of a spin valve structure, wherein a fixed layer (pinned layer) comprising a ferromagnetic layer whose magnetization direction is fixed and a recording layer (free layer) comprising a ferromagnetic layer whose magnetization direction varies in response to an external magnetic field are disposed via a non-magnetic layer. Since the electric resistance of the magnetoresistive element of the spin valve structure varies in response to a change of the magnetization direction of the recording layer, the magnetoresistive element can be operated as a memory by storing data in response to a change in the electric resistance of the magnetoresistive element.

In other words, in the memory cell of the MRAM device, an extremely thin tunnel insulating layer is disposed between the recording layer and the fixed layer comprising a magnetic film. This structure having the tunnel insulating layer interposed between the fixed layer and the recording layer is referred to as a magnetic tunnel junction structure. This magnetic tunnel junction structure comprises a magnetoresistive element called TMR (Tunneling Magneto Resistance).

In the magnetoresistive element, the magnetization direction in the fixed layer is fixed to a fixed direction. On the other hand, the magnetization direction in the recording layer is controllable by a magnetic field from the outside. In a parallel state where the magnetization direction of the fixed layer and that of the recording layer are the same, the resistance value between the fixed layer and the recording layer of the magnetoresistive element decreases. In contrast, in an antiparallel state where the magnetization direction of the fixed layer and that of the recording layer are opposite to each other, the resistance value between the fixed layer and the recording layer of the magnetoresistive element increases. Accordingly, the magnetoresistive element can be operated as a memory by associating the parallel state or antiparallel state of the magnetization directions with a digital value "0" or "1" and reading a change in the resistance value.

In the memory cell of the MRAM described above, the magnetization direction of the recording layer constituting the magnetoresistive element might fluctuate due to an external magnetic field of the semiconductor device and the recorded state of data may fluctuate accordingly. For this reason, the MRAM device needs to have resistance against an external magnetic field.

For example, there is known a structure, wherein in order to obtain the resistance against an external magnetic field, a magnetic shield material comprising permalloy is provided over and under a semiconductor chip having the MRAM formed therein.

Here, how to effectively improve the resistance of the MRAM device against an external magnetic field is important, given the configuration of providing a magnetic shield material at least over a semiconductor chip (on the MRAM forming surface side) or the configuration of providing the magnetic shield material over and under the semiconductor chip.

Furthermore, it is important to have the entire size and thickness of the semiconductor device (semiconductor package) within a predetermined package specification with the magnetic shield material provided.

Moreover, it is important to provide the semiconductor package with a magnetic shield material having a stable magnetic shielding characteristic.

The present invention has been made in view of the above circumstances and provides a technique that can achieve an improvement in the data retention characteristic of an MRAM device by improving the resistance against an external magnetic field in a semiconductor device including the MRAM device.

The other purposes and the new feature of the present invention will become clear from the description of the present specification and the accompanying drawings.

The following explains briefly the outline of a typical invention among the inventions disclosed in the present application.

A semiconductor device according to a representative embodiment comprises: (a) a die pad; (b) a plurality of leads disposed around the die pad; and (c) a semiconductor chip having a principal surface and a rear surface opposite to the principal surface, and including a plurality of magnetic memory elements and a plurality of bonding pads on the principal surface side, the semiconductor chip being disposed over the die pad. The semiconductor device further comprises: (d) a first magnetic shield material disposed between the die pad and the rear surface of the semiconductor chip; and (e) a second magnetic shield material disposed over the principal surface of the semiconductor chip, the second magnetic shield material being disposed so as to cover a region where the magnetic memory elements are formed. The semiconductor device further comprises: (f) a plurality of bonding wires electrically coupling the bonding pads to the leads, respectively; and (g) a resin body sealing a part of the respective leads, the bonding wires, the die pad, the semiconductor chip, the first magnetic shield material, and the second magnetic shield material. Here, an area of the second magnetic shield material is formed smaller than an area of the principal surface of the semiconductor chip, and a thickness of the second magnetic shield material is formed thicker than a thickness of the first magnetic shield material.

Moreover, a method of manufacturing a semiconductor device according to a representative embodiment comprises the steps of: (a) preparing a lead frame including a die pad and a plurality of leads disposed around the die pad; and (b) preparing a semiconductor wafer having a principal surface and a rear surface opposite to the principal surface, the semiconductor wafer including on the principal surface side a plurality of chip areas where a plurality of magnetic memory elements and a plurality of bonding pads are formed. The method of manufacturing a semiconductor device further comprises the steps of: (c) sticking a first adhesive film material to the rear surface of the semiconductor wafer; and (d) after the step (c), sticking a first magnetic shield material to the rear surface of the semiconductor wafer via the first film material. The method of manufacturing a semiconductor device further comprises the steps of: (e) after the step (d), sticking a second adhesive film material to a rear surface of the first magnetic shield material; and (f) after the step (e), dicing the semiconductor wafer and the first magnetic shield material stuck to the rear surface of the semiconductor wafer altogether and thereby forming a plurality of semiconductor chips to which the singulated first magnetic shield material is stuck. The method of manufacturing a semiconductor device further comprises the steps of: (g) after the step (f), mounting the semiconductor chip, to which the first magnetic shield material is stuck, over the die pad so that the first magnetic shield material may be sandwiched between the semiconductor chip and the die pad; and (h) disposing a second magnetic shield material over the principal surface of the semiconductor chip so as to cover a region where the magnetic memory elements are formed. The method of manufacturing a semiconductor device further comprises the steps of: (i) electrically coupling the leads to the bonding pads with a plurality of bonding wires, respectively, and (j) sealing apart of the respective leads, the bonding wires, the die pad, the semiconductor chip, the first magnetic shield material, and the second magnetic shield material with a resin body. Here, the area of the second magnetic shield material is formed smaller than the area of the principal surface of the semiconductor chip, and the thickness of the second magnetic shield material is formed thicker than the thickness of the first magnetic shield material.

The advantages obtained by the representative aspects among the aspects of the present invention disclosed in the present application are described briefly as follows.

In a semiconductor device including an MRAM device, the resistance against an external magnetic field can be improved. As a result, the data retention characteristic of the MRAM device can be improved. Furthermore, a reduction in the thickness of the semiconductor device (semiconductor package) can be achieved.

DETAILED DESCRIPTION OF THE PREFERRED EMBODIMENTS

Figure 1:
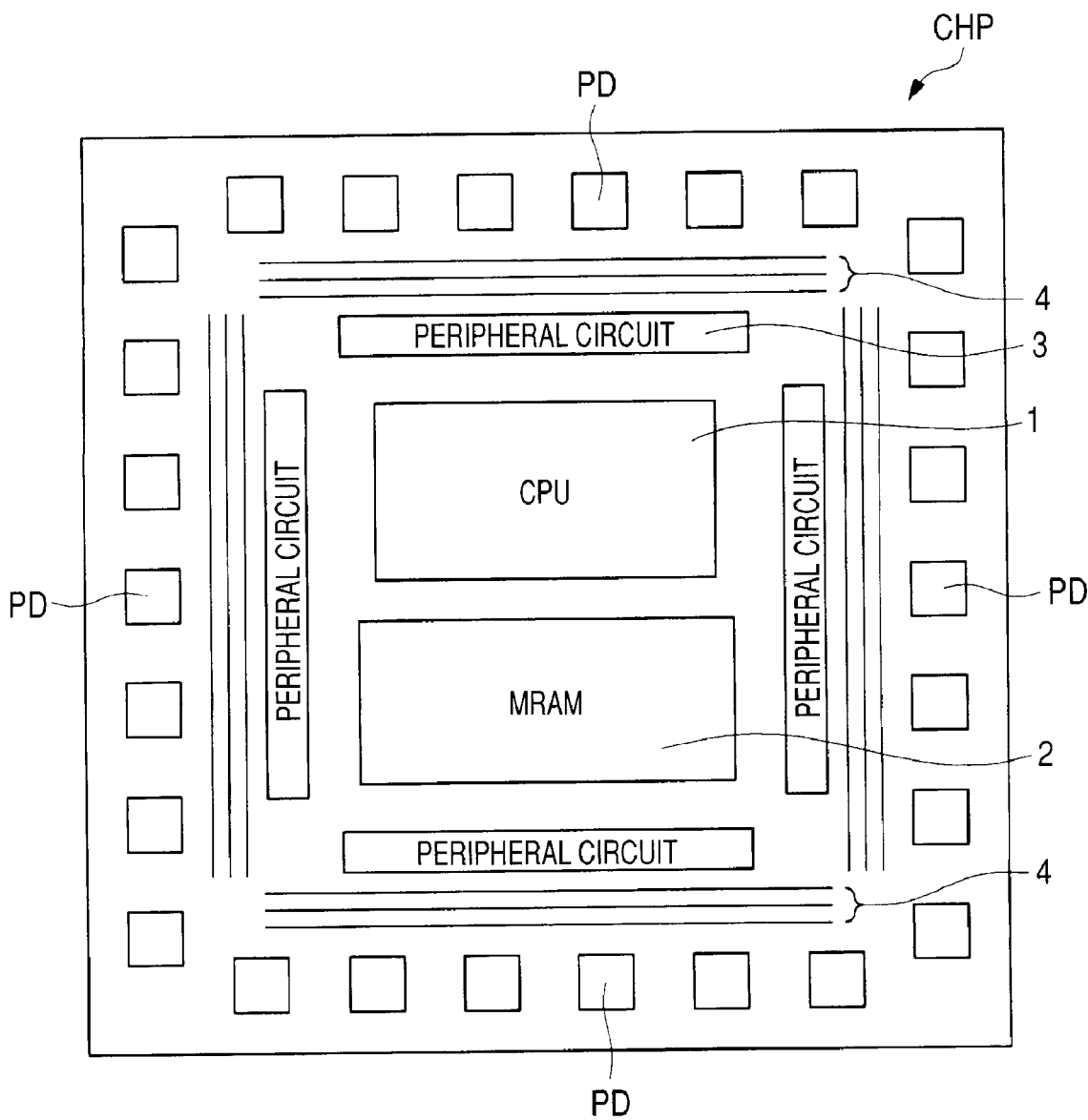
FIG. 1 is a block diagram showing a configuration of a semiconductor chip in an embodiment 1 according to the present invention.

In the following embodiments, when required for convenience sake, one embodiment is divided into a plurality of sections or embodiments and described. However, unless otherwise specifically stated, these sections or embodiments are not mutually independent, but one of them is the modification, the detail, the supplementary explanation, or the like of a part of or all of the other.

Moreover, in the following embodiments, when referring to the number or the like of elements (including the number of pieces, the value, the amount, the range, or the like), except, for example, when specially stated or when apparently limited to a specific number in principle, the invention is not limited to this specific number and the number may be greater or fewer than this specific number.

Furthermore, in the following embodiments, of course, the constituent elements (including element steps and the like) are not always indispensable except, for example, when specially stated or when apparently considered to be indispensable in principle.

Similarly, in the following embodiments, the shape, position, and the like of a constituent element to be referred to include those substantially approximate or similar to the relevant shape and the like, except, for example, when specially stated or when apparently considered not to be so in principle. This is also true of the above-described values and ranges.

Moreover, in all the drawings for describing the embodiments, the same member is basically given the same reference numeral to omit the duplicated description. Note that, for clarity of drawings, even a plan view may be hatched.

Embodiment 1

FIG. 1 is a plan view showing a layout example of a semiconductor chip in the present embodiment 1. As shown in FIG. 1, a CPU (central processing device, microprocessor unit) 1, an MRAM (memory unit) 2, a peripheral circuit 3, and a power line 4 are formed in a semiconductor chip CHP in the present embodiment 1. Then, a pad PD, which is an input/output external terminal for coupling these circuits to external circuits, is formed in a periphery of the semiconductor chip CHP.

The CPU (circuit) 1 is also called a central processing section, and corresponds to the core of a computer or the like. The CPU 1 reads an instruction from a memory device and decodes it, performs a wide variety of operations and controls based on the decoded instruction, and requires high speed in the processings. Accordingly, among the elements formed in the semiconductor chip CHP, an MISFET (Metal Insulator Semiconductor Field Effect Transistor) constituting the CPU 1 needs to have a relatively high current drive capability. Namely, the MISFET is formed with a low-breakdown voltage MISFET.

The MRAM (circuit) 2 is a memory from which stored memory information can be randomly read as required or into which memory information can be newly written, and is also called a "random access memory". Examples of the RAM as an IC memory include two types; a DRAM (Dynamic RAM) using a dynamic circuit and an SRAM (Static RAM) using a static circuit, however, an MRAM that is a next-generation device is used in the present embodiment 1. The MRAM 2 is a memory element utilizing magnetism, wherein an electron spin is used as a memory element. The structure of the MRAM 2 is similar to that of the DRAM, i.e., the MRAM 2 has a structure wherein a capacitor in the DRAM is replaced with a magnetic tunnel junction element. The MRAM 2 is a non-volatile memory because a magnetization state is used in storing data, and the MRAM 2 is characterized in that a memory state is held even if the power is turned off, unlike the DRAM or the like. Furthermore, the MRAM 2 has a high-speed random access function (at a speed of several nanoseconds) as with the SRAM. That is, the MRAM 2 is a memory element that not only functions as a non-volatile memory but also has a high-speed random access function.

The peripheral circuit 3 is a circuit for constituting a system together with the CPU 1 and MRAM 2, and comprises, for example, a power supply circuit, a clock circuit, a reset circuit, and the like. The peripheral circuit 3 includes a digital circuit for performing digital signal processing and an analog circuit for processing analog signals. The analog circuit is a circuit for handling a voltage or current signal, i.e., an analog signal, which continuously varies with time, and the analog circuit comprises, for example, an amplifier, a conversion circuit, a modulation circuit, an oscillation circuit, a power supply circuit, and the like.

The power line 4 is a line for supplying a voltage for operating the CPU 1, MRAM 2, and peripheral circuit 3, and comprises a power source line and a ground line. The CPU 1, MRAM 2, and peripheral circuit 3 are directly or indirectly coupled to the power line 4 so as to be able to operate by the power supply from the power line 4.

The pad PD serves as an external connection terminal for inputting/outputting signals from/to an apparatus (circuit) coupled to the outside of the semiconductor chip CHP. An input signal is input to the CPU 1 or the like formed in the semiconductor chip CHP via the pad PD, or an output signal from the CPU 1 is output via the pad PD to an apparatus (circuit) coupled to the outside of the semiconductor chip CHP.

In FIG. 1, a plurality of pads PD is disposed along the periphery of the semiconductor chip CHP, and the power line 4 is disposed proximate to the pads PD. The CPU 1, MRAM 2, and peripheral circuit 3 are disposed in an inner area of the power line 4. That is, the CPU 1, MRAM 2, and peripheral circuit 3 are disposed in a center area of the semiconductor chip CHP surrounded by the power line 4.

Figure 2:
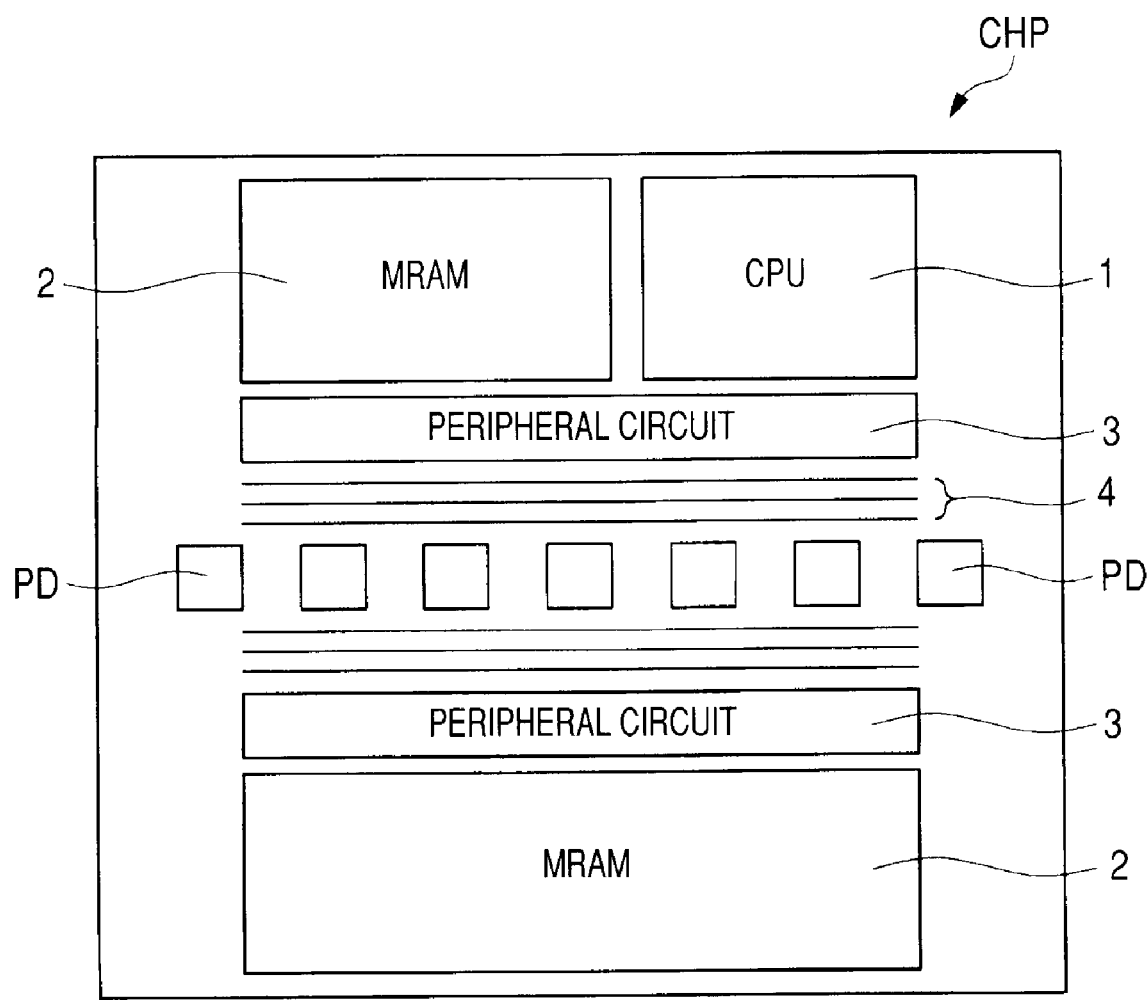
FIG. 2 is a block diagram showing another configuration of the semiconductor chip in the embodiment 1.

Note that, FIG. 1 is an example of the layout of the semiconductor chip CHP, and the semiconductor chip CHP may be laid out as shown in FIG. 2, for example. FIG. 2 shows another layout example of the semiconductor chip CHP in the present embodiment 1. FIG. 2 is a chip layout drawing showing an example of a pad array and a circuit block array effective for the configuration of an LOC (Lead on chip). As shown in FIG. 2, a plurality of pads PD is disposed along a center area (center line) of the semiconductor chip CHP, and two sets of power lines 4 are disposed in an adjacent region sandwiching the pads PD. Then, the CPU 1, MRAM 2, and peripheral circuit 3 are disposed outside the power line 4. Specifically, a part of the MRAM 2 and a part of the peripheral circuit 3 are disposed outside the lower power line 4, while outside the upper power line 4, a part of the peripheral circuit 3, the CPU 1 and the MRAM 2 are formed. In either case of the layout configuration as shown in FIG. 1 and the layout configuration as shown in FIG. 2, since the MRAM 2 is susceptible to an external magnetic field, the MRAM 2 is preferably disposed so as to be spaced a certain distance from the power line 4. The reason is that a relatively high current flows through the power line 4 and thus a high external magnetic field is generated in the periphery. Namely, in order to be affected as less as possible by this external magnetic field, the MRAM 2 is preferably disposed so as to be spaced a certain distance from the power line 4.

Figure 3:
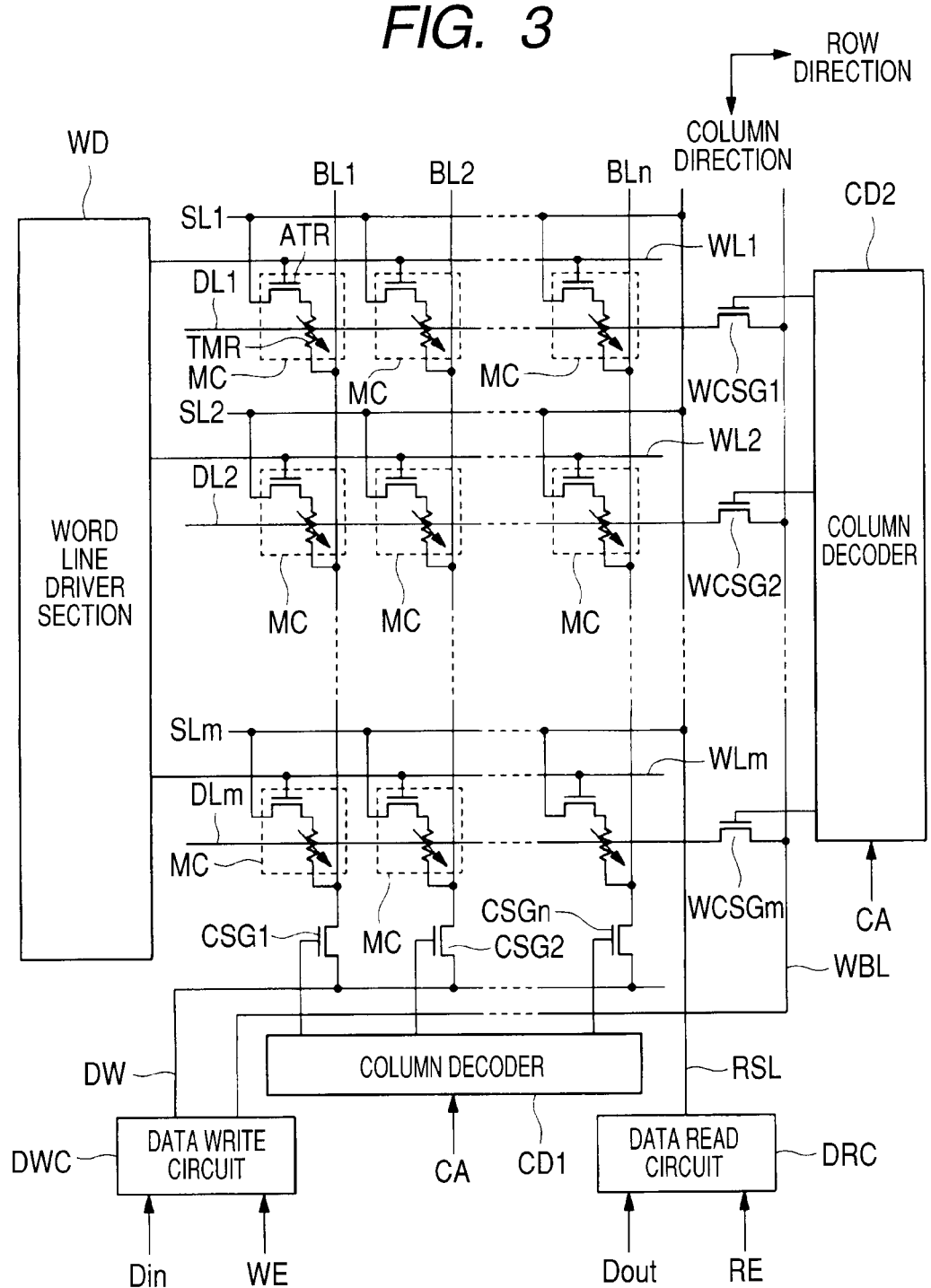
FIG. 3 shows a circuit configuration of a memory cell array constituting an MRAM.

Subsequently, an internal configuration of the MRAM 2 is described. FIG. 3 shows a circuit configuration of the MRAM 2. In FIG. 3, the MRAM 2 is configured to perform a random access to a specific memory cell based on a control signal and an address signal from the outside and then execute a write of input data Din or a read of output data Dout with respect to the accessed specific memory cell. Hereinafter, the circuit configuration for achieving this function is described.

In FIG. 3, in the MRAM 2, a plurality of memory cells MC is disposed in a matrix form, such as n rows in a row direction (horizontal direction) and m columns in a column direction (longitudinal direction). That is, the MRAM 2 constitutes a memory cell array comprising a plurality of memory cells MC disposed in a matrix form.

Along the row of the memory cell array, word lines WL1 to WLm and source lines SL1 to SLm are disposed so as to extend in parallel to each other. Furthermore, along the row of the memory cell array, digit lines DL1 to DLm are also disposed in parallel to each other. On the other hand, along the column of the memory cell array, bit lines BL1 to BLn are disposed so as to extend in parallel to each other. That is, in the memory cell array constituting the MRAM 2, while the word lines WL1 to WLm, the source lines SL1 to SLm, and the digit lines DL1 to DLm are disposed in parallel to each other in the horizontal direction (row direction), the bit lines BL1 to BLn are disposed in the longitudinal direction (column direction) perpendicular to the horizontal direction.

Next, at the respective intersections in a matrix form of the memory cell array, each of the memory cells MC is formed. Each of the memory cells MC includes a magnetoresistive element (a magnetic tunnel junction element, a magnetic memory element) TMR of a magnetic tunnel junction structure and an access transistor ATR comprising an MISFET (Metal Insulator Semiconductor Field Effect Transistor). The magnetoresistive element TMR and the access transistor ATR are coupled so that a path of a tunnel current flowing through the magnetoresistive element TMR and a path of a channel current flowing through the access transistor ATR may be coupled in series. Specifically, in each of the memory cells MC, a drain region of the access transistor ATR is configured to be coupled to the magnetoresistive element TMR.

In each of the memory cells MC, a source region of the access transistor ATR is coupled to the source line (one of the source lines SL1 to SLm) constituting the memory cell array. Then, the drain region of the access transistor ATR is coupled to one end of the magnetoresistive element TMR, and the other end of the magnetoresistive element TMR is coupled to the bit line (one of the bit lines BL1 to BLn) constituting the memory cell array. Furthermore, a gate electrode of the access transistor ATR is coupled to the word line (one of the word lines WL1 to WLm) constituting the memory cell array.

Subsequently, the MRAM 2 includes a word line driver section WD coupled to the word lines WL1 to WLm. The word line driver section WD has a function to selectively activate the word line (one of the word lines WL1 to WLm) corresponding to a specific memory cell MC for data access in response to a result of row selection during data read (also referred to as "during data access").

Furthermore, the MRAM 2 includes a data line DW for transmitting read data, a write bit line WBL for transmitting write data, a read source line RSL, column decoders CD1, CD2, a data write circuit DWC, and a data read circuit DRC.

The read source line RSL electrically couples the respective source lines SL1 to SLm to the data read circuit DRC. The data line DW is coupled to the bit lines BL1 to BLn via a selection transistor, and electrically couples the bit lines BL1 to BLn to the data write circuit DWC. The write bit line WBL is coupled to the digit lines DL1 to DLm via a selection transistor, and electrically couples the digit lines DL1 to DLm to the data write circuit DWC.

The data write circuit DWC has a function to apply a predetermined voltage to the data line DW and the write bit line WBL when a write-enable signal WE and the input data Din are input from the outside. When a read enable signal RE is input from the outside, the data read circuit DRC amplifies a voltage on the read source line RSL using a sense amplifier, and compares this amplified voltage with a voltage value across a reference resistor (not illustrated). The data read circuit DRC also has a function to output the output data Dout based on this comparison result.

Moreover, the MRAM 2 includes selection transistors corresponding to the respective columns of the memory cell array, wherein gate electrodes of these selection transistors are indicated by gate electrodes CSG1 to CSGn. Likewise, the MRAM 2 includes selection transistors corresponding to the respective rows of the memory cell array, wherein gate electrodes of these selection transistors are indicated by gate electrodes WCSG1 to WCSGm.

The column decoder CD1 has a function to decode a column address CA, and based on this result selectively activate the gate electrodes CSG1 to CSGn during data write and during data read, respectively. The activated gate electrode (one of CSG1 to CSGn) has a function to electrically couple the data line DW to a corresponding bit line (one of the bit lines BL1 to BLn).

Likewise, the column decoder CD2 has a function to decode the column address CA, and based on this result selectively activate the gate electrodes WCSG1 to WCSGm during data write and during data read, respectively. The activated gate electrode (one of WCSG1 to WCSGn) has a function to electrically couple the write bit line WBL to a corresponding digit line (one of the digit lines DL1 to DLm).

The circuit of the MRAM 2 in the present embodiment 1 is configured as described above, and hereinafter, a structure of the memory cell of the MRAM 2 is described.

Figure 4:
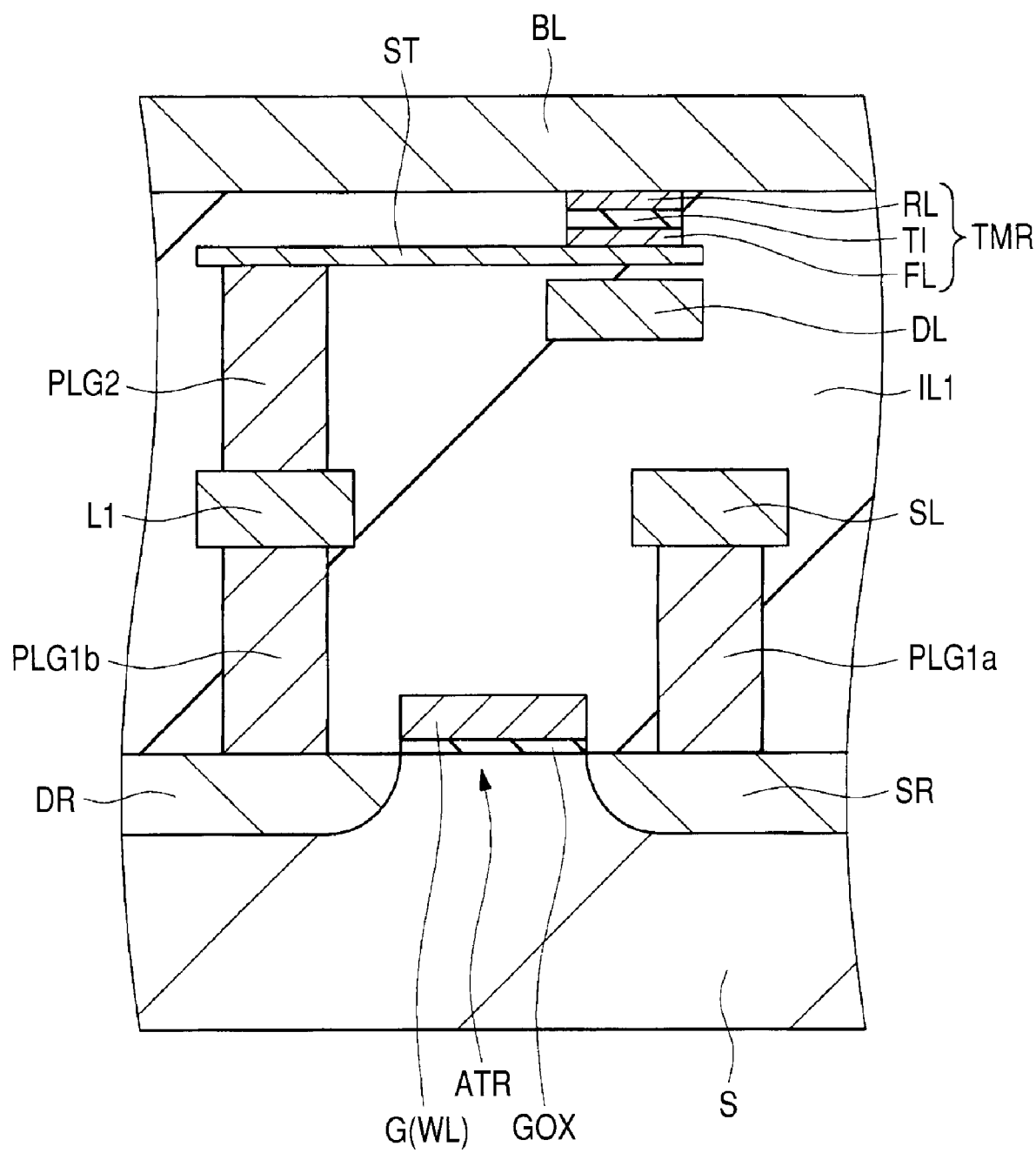
FIG. 4 is a cross sectional view showing a configuration of the memory cell of the MRAM.

FIG. 4 is a cross sectional view showing the memory cell of the MRAM in the present embodiment 1. As shown in FIG. 4, the access transistor ATR is formed in the principal surface (upper surface) of a semiconductor substrate S. The access transistor ATR includes a source region SR and a drain region DR that are formed so as to be spaced from each other in the semiconductor substrate S. A gate insulating film GOX comprising, for example, a silicon oxide film is formed over a channel forming region that is sandwiched by the source region SR and the drain region DR. Then, a gate electrode G (corresponds to the word line WL) comprising, for example, a polysilicon film is formed over the gate insulating film GOX.

The magnetoresistive element TMR has a fixed layer FL, a tunnel insulating layer TI, and a recording layer RL laminated in this order from the bottom. The fixed layer FL is formed from a ferromagnetic layer whose magnetization direction is fixed, and the recording layer RL is formed from a ferromagnetic layer whose magnetization direction varies in response to an external magnetic field. The tunnel insulating layer TI is a non-magnetic layer, and is disposed between the fixed layer FL and the recording layer RL.

The magnetoresistive element TMR is disposed in an intersection area of the bit line BL and the digit line DL in a planar view. Then, the digit line DL is disposed so as to be spaced a predetermined interval from the fixed layer FL, below the fixed layer FL that is a constituent element of the magnetoresistive element TMR. On the other hand, the bit line BL extends over the recording layer RL so as to electrically couple to the recording layer RL.

The fixed layer FL that is a constituent element of the magnetoresistive element TMR is electrically coupled to a strap ST serving as a wiring, and the strap ST is coupled to a wiring L1 via a plug PLG2 formed in an interlayer insulating film IL1. Furthermore, the wiring L1 is electrically coupled to the drain region DR of the access transistor ATR via a plug PLG1$b$ formed in the interlayer insulating film IL1. Accordingly, the fixed layer FL of the magnetoresistive element TMR will be coupled to the drain region DR of the access transistor ATR via the strap ST, the plug PLG2, the wiring L1, and the plug PLG1$b$. On the other hand, the source region SR of the access transistor ATR is electrically coupled to a source line SL via a plug PLG1$a$ formed in the interlayer insulating film IL1. As apparent from the above, the access transistor ATR and the magnetoresistive element TMR are coupled in series between the bit line BL and the source line SL. In this manner, the memory cell of the MRAM in the present embodiment 1 is configured.

Subsequently, the operation of the MRAM is described with reference to FIG. 4. First, the write operation is described. When a current flows in a predetermined direction of the bit line and a current flows through the digit line DL, a first synthetic magnetic field due to both the currents is applied to the magnetoresistive element TMR. Then, the magnetization direction of the recording layer RL of the magnetoresistive element aligns with the direction (a first direction) of the first synthetic magnetic field.

On the other hand, when a current flows in a direction opposite to the above-described predetermined direction of the bit line and a current flows through the digit line DL, a second synthetic magnetic field is generated in a direction different from that of the first synthetic magnetic field. Then, the magnetization direction of the recording layer RL will align with the direction of the second synthetic magnetic field. Thus, the magnetization direction of the recording layer RL agrees with the second direction opposite to the first direction.

In this manner, the magnetization direction of the recording layer RL can be controlled to be the first direction or the second direction by supplying a current to the digit line DL and also controlling the direction of a current fed to the bit line BL. This means that a binary state of "0" and "1" can be stored in correspondence with the magnetization direction of the recording layer RL. Thereafter, the magnetization direction of the recording layer RL can be held even when the conduction is turned off. Note that, the magnetization direction of the fixed layer FL will not change even if the first synthetic magnetic field and the second synthetic magnetic field are generated.

Next, the read operation is described. In the case of the read operation, a current is fed as follows without involvement of the digit line. Namely, with the access transistor ATR turned on, a current is supplied in a path from the bit line BL to the magnetoresistive element TMR, strap ST, plug PLG2, wiring L1, plug PLG1$b$, drain region DR, source region SR, plug PLG1$a$, and source line SL. Thereby, a change in the resistance value of the magnetoresistive element TMR is detected with a sense amplifier (not shown). At this time, if the magnetization direction of the recording layer RL is parallel to that of the fixed layer FL, the resistance value of the magnetoresistive element TMR will decrease. On the other hand, if the magnetization direction of the recording layer RL is antiparallel to that of the fixed layer FL, the resistance value of the magnetoresistive element TMR will increase. Accordingly, the binary state of the recording layer RL is reflected by the magnitude of the resistance value of the magnetoresistive element TMR and is read to the outside. In this manner, information (data) stored in the magnetoresistive element TMR can be read. By disposing such a memory cell in a matrix form, a high-capacity MRAM can be realized.

In the above, a semiconductor chip having the MRAM formed therein in the present embodiment 1 is described, and this semiconductor chip having the MRAM formed therein will be packaged. Hereinafter, a package configuration of the semiconductor chip having the MRAM formed therein is described.

Figure 5:
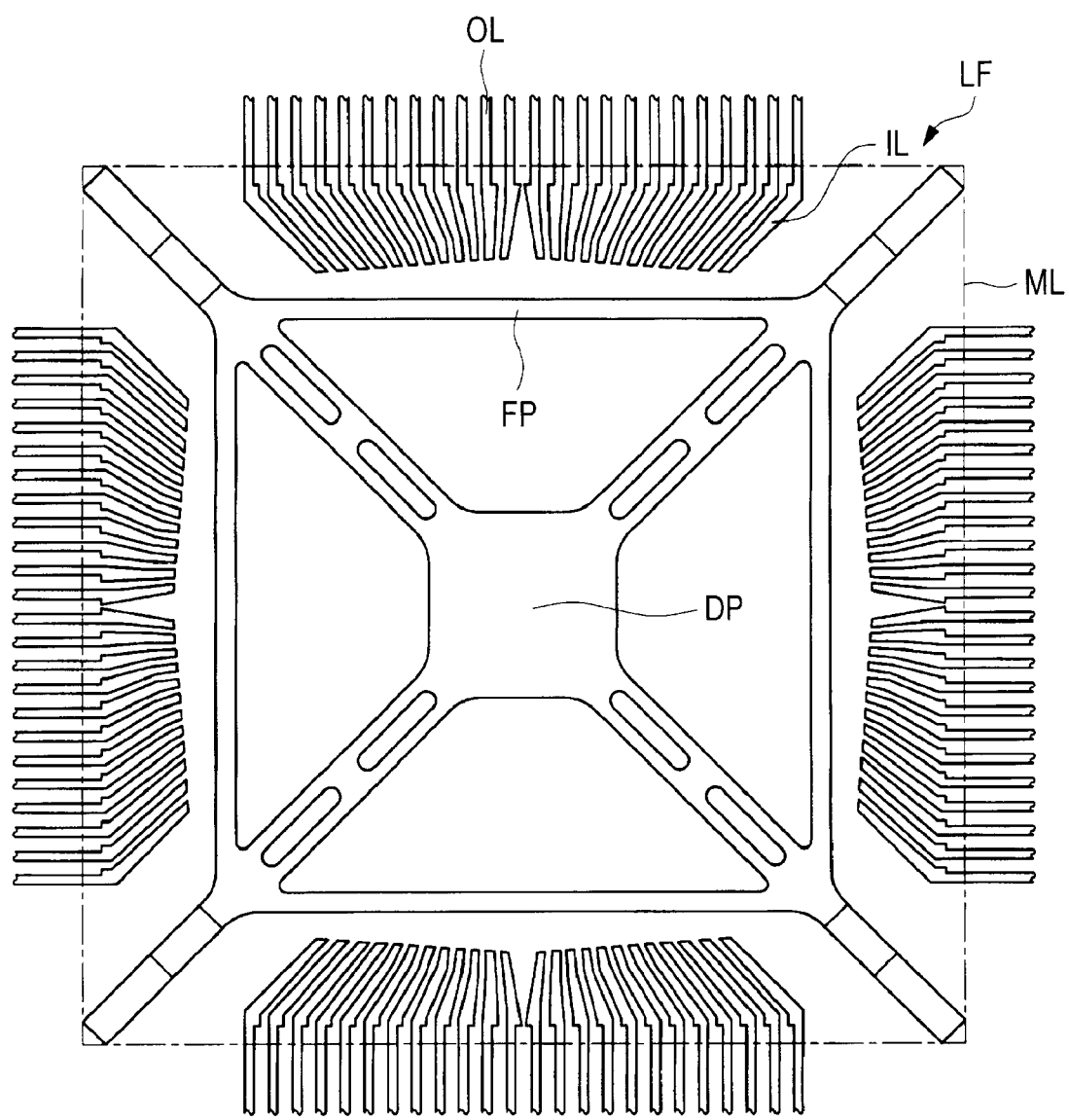
FIG. 5 shows a lead frame used in the embodiment 1.
Figure 6:
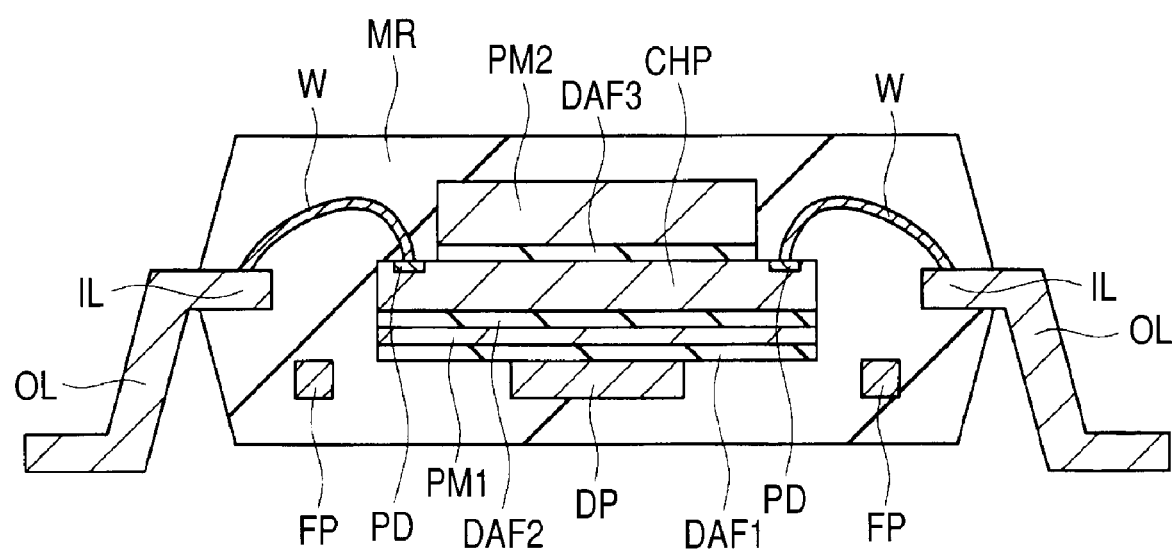
FIG. 6 is a cross sectional view showing a package in the embodiment 1.
Figure 7:
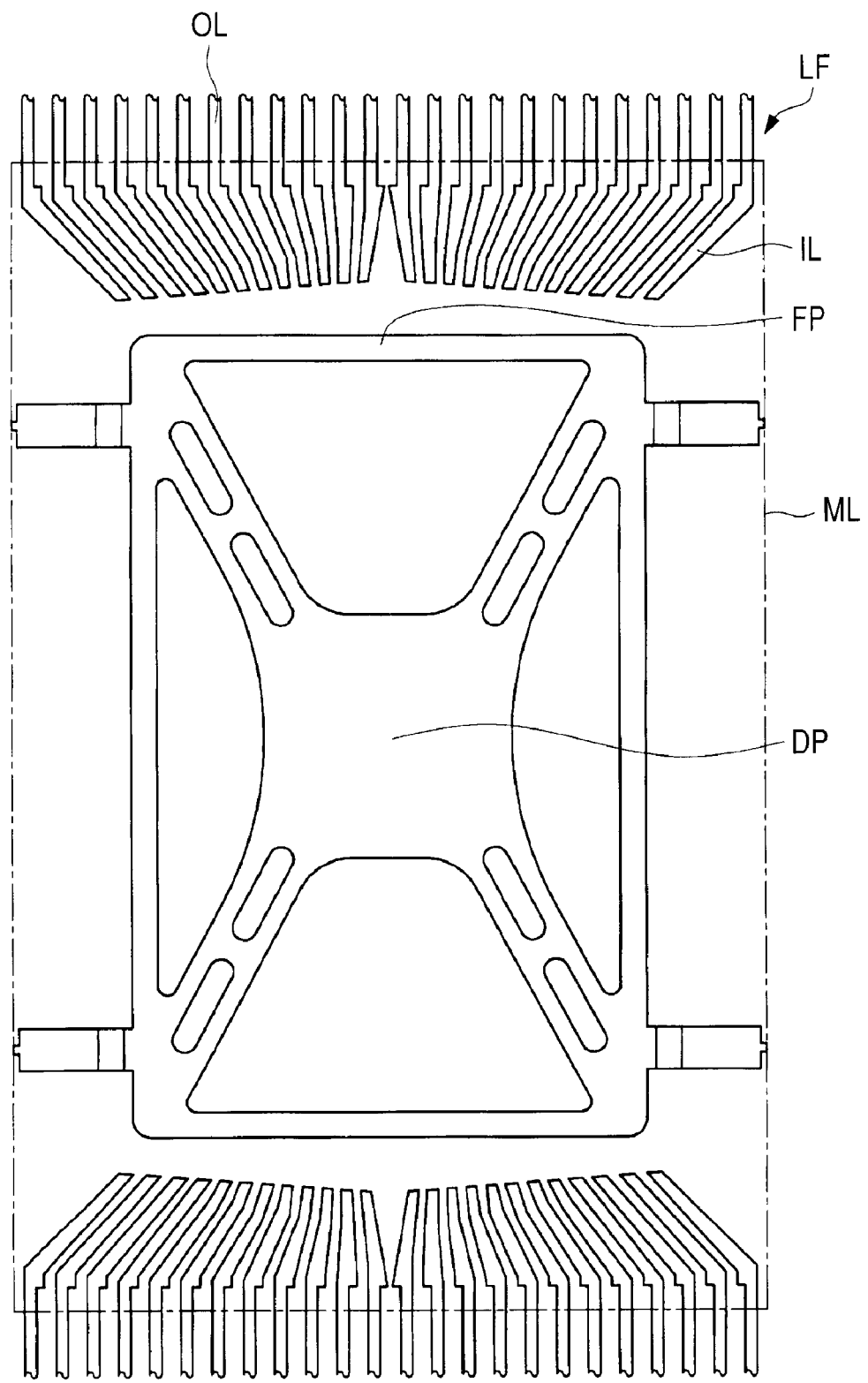
FIG. 7 shows another example of the lead frame.

First, FIG. 5 shows a configuration of a lead frame LF for mounting a semiconductor chip. As shown in FIG. 5, the lead frame LF mainly includes a die pad DP for mounting a semiconductor chip, a frame part FP, an inner lead IL, and an outer lead OL. Then, among the lead frame LF, a region surrounded by a mold line ML is a region to be sealed with a resin body. Hereinafter, a package formed by mounting a semiconductor chip over the thus configured lead frame LF is described. FIG. 6 is a cross sectional view showing a configuration of a package (semiconductor device) in the present embodiment 1. In FIG. 6, the package in the present embodiment 1 is a QFP (Quad Flat Package) type package, for example. The package shape may be an SOP (Small Outline Package) type package using a lead frame as shown in FIG. 7. As shown in FIG. 6, in the package in the present embodiment 1, a magnetic shield material PM1 is disposed via a die attach film DAFT over a die pad DP, and the semiconductor chip CHP is disposed via a die attach film DAF2 over the magnetic shield material PM1. Furthermore, a magnetic shield material PM2 is disposed via a die attach film DAF3 over the semiconductor chip CHP.

The MRAM is formed in the semiconductor chip CHP, and the pad PD that is an I/O terminal is formed in the principal surface (upper surface) of the semiconductor chip CHP. The pad PD is electrically coupled to the inner lead IL with a wire W.

The die pad DP, the magnetic shield materials PM1, PM2, the semiconductor chip CHP, the inner lead IL, the wire W, and the die attach films DAFT to DAF3 are sealed with a resin body MR. Then, the outer lead OL is exposed from the resin body MR.

The semiconductor chip CHP is mainly composed of silicon, and includes a circuit, in which a plurality of MRAMs and a plurality of MISFETs are formed, on the principal surface side. The die pad DP, frame part FP, and inner lead IL constituting the lead frame are formed from a copper material, a 42 alloy material that is one type of alloys of nickel and iron, or the like. On the other hand, the magnetic shield materials PM1, PM2 are formed from permalloy that is one type of alloys of nickel and iron. Although permalloy is a material close to the 42 alloy, which is also an alloy of nickel and iron, in terms of the mechanical properties, permalloy is a material with an improved magnetic characteristic due to a change in the mixing ratio of nickel and iron, a change in the heat treatment condition, or the like. For the wire W, a gold wire is used, for example. Furthermore, the die attach films DAF1 to DAF3 are adhesive films containing a thermoplastic resin, and comprise, for example, a polyimide resin (thermoplastic resin) containing a small amount of epoxy resin (thermosetting resin). Note that a resin paste may be used in place of the die attach films DAF1 to DAF3. In particular, in bonding the semiconductor chip CHP to the magnetic shield material PM2 to be mounted over the semiconductor chip CHP, the die attach film DAF3 is advantageous but a resin paste may be used.

Here, in the present embodiment 1, the area of the die pad DP is smaller than the area of the magnetic shield material PM1 or the semiconductor chip CHP. That is, in the present embodiment 1, the so-called small tab is used as the die pad DP. This is due to the following reason. Namely, the die pad DP is directly in contact with the resin body MR whereas the die pad DP is formed from the 42 alloy material or a copper material, for example. On the other hand, the resin body MR is formed from a resin. For this reason the adhesion between the die pad DP and the resin body MR may not be such excellent due to a difference in the coefficient of linear expansion, and the contact area between the die pad DP and the resin body MR is preferably as small as possible from a view point of the moldability of the package. In other words, in view of suppressing a decrease in the adhesion between the die pad DP and the resin body MR to improve the reliability of the package, the contact area between the die pad DP and the resin body MR is preferably small.

Furthermore, the resin body MR is likely to contain moisture. For this reason, if a temperature cycle is added by a reflow treatment or the like during package mounting, moisture absorbed in the resin body MR will evaporate into vapor. This vapor is likely to collect at an interface (at the flat area where the adhesion is low) between the resin body MR and the die pad DP. Then, the vapor causes bubbles at the interface between the resin body MR and the die pad DP, and separation of the resin body MR from the die pad DP will occur. Moreover, the vapor turned into bubbles will expand due to the temperature cycle and a stress will be applied to the resin body MR. The application of stress causes cracks in the resin body MR. If a crack occurs in the resin body MR, the reliability of the package will decrease, which causes a failure. In particular, the larger the contact area between the resin body MR and the die pad DP, the more remarkable the separation of the resin body MR from the die pad DP due to the vapor becomes. The reason is that the larger the contact area between the resin body MR and the die pad DP, the more the amount of vapor collecting at the interface between the resin body MR and the die pad DP will increase, and the magnitude of a stress due to the expansion of this vapor will also increase. Namely, the larger the area of the die pad DP, the more likely the crack caused by temperature cycle will occur. Accordingly, in the present embodiment 1, a small tab, i.e., the die pad DP of a size smaller than the area of the magnetic shield material PM1 or the semiconductor chip CHP, is employed to improve the reliability of the package.

The package (semiconductor device) in the present embodiment 1 is configured as described above, and next, the features of the package in the present embodiment 1 are described. In FIG. 6, one of the features in the present embodiment 1 is in that the thickness of the magnetic shield material PM2 is formed thicker than the thickness of the magnetic shield material PM1, on the assumption that the area of the magnetic shield material PM1 is made not smaller than that of the principal surface of the semiconductor chip CHP and the area of the magnetic shield material PM2 is made smaller than the area of the principal surface of the semiconductor chip CHP. Namely, one of the features of the present embodiment 1 is in that the thickness of the magnetic shield material PM2 formed over the principal surface of the semiconductor chip CHP is formed thicker than the thickness of the magnetic shield material PM1 formed in the rear surface of the semiconductor chip CHP. Thereby, on the principal surface side of the semiconductor chip CHP, an external magnetic field can be effectively shielded. Namely, an external magnetic field can be absorbed into the magnetic shield material PM2 by increasing the thickness of the magnetic shield material PM2, and therefore, by disposing the thick magnetic shield PM2 over the principal surface of the semiconductor chip CHP, the region on the principal surface side of the semiconductor chip CHP can be effectively shielded from an external magnetic field. For the MRAM formed on the principal surface side of the semiconductor chip CHP, the effect by an external magnetic field can be suppressed by shielding mainly the principal surface side of the semiconductor chip CHP. Accordingly, the data retention characteristic of the MRAM formed on the principal surface side of the semiconductor chip CHP can be improved.

In the present embodiment 1, the MRAM is formed in the semiconductor chip CHP, and the MRAM stores information (data) by controlling the direction of an electron spin with a magnetic field. Accordingly, if the MRAM is carelessly exposed under the effect of an external magnetic field, the direction of an electron spin will change and the information will be lost in the magnetic substance constituting the MRAM. That is, the MRAM has the property that the data retention characteristic will degrade when affected by a strong external magnetic field. From this fact, the semiconductor chip CHP, in which the MRAM is formed, is preferably prevented from being affected by an external magnetic field.

Then, in order to protect the semiconductor chip CHP, in which the MRAM is formed, from an external magnetic field, magnetic shielding of the semiconductor chip CHP, in which the MRAM is formed, has been performed. In order to shield the semiconductor chip CHP from an external magnetic field, the entire periphery of the semiconductor chip CHP might be enclosed by a magnetic shield material. However, as shown in FIG. 6, in the package of the semiconductor chip CHP, because the pad PD of the semiconductor chip CHP and the inner lead IL need to be electrically coupled to each other with the wire W, it is difficult to dispose the magnetic shield material so as to three-dimensionally enclose the semiconductor chip CHP.

For this reason, a structure has been employed in which the semiconductor chip CHP is sandwiched by magnetic shield materials. For example, as shown in FIG. 6, the semiconductor chip CHP is shielded from an external magnetic field by employing a structure, in which the magnetic shield material PM1 is disposed in the rear surface of the semiconductor chip CHP and the magnetic shield material PM2 is disposed over the principal surface (the upper surface or element forming surface) of the semiconductor chip CHP. Even a structure, in which the semiconductor chip CHP is sandwiched by the magnetic shield materials in this manner provides an effect of shielding the semiconductor chip CHP from an external magnetic field.

Figure 8:
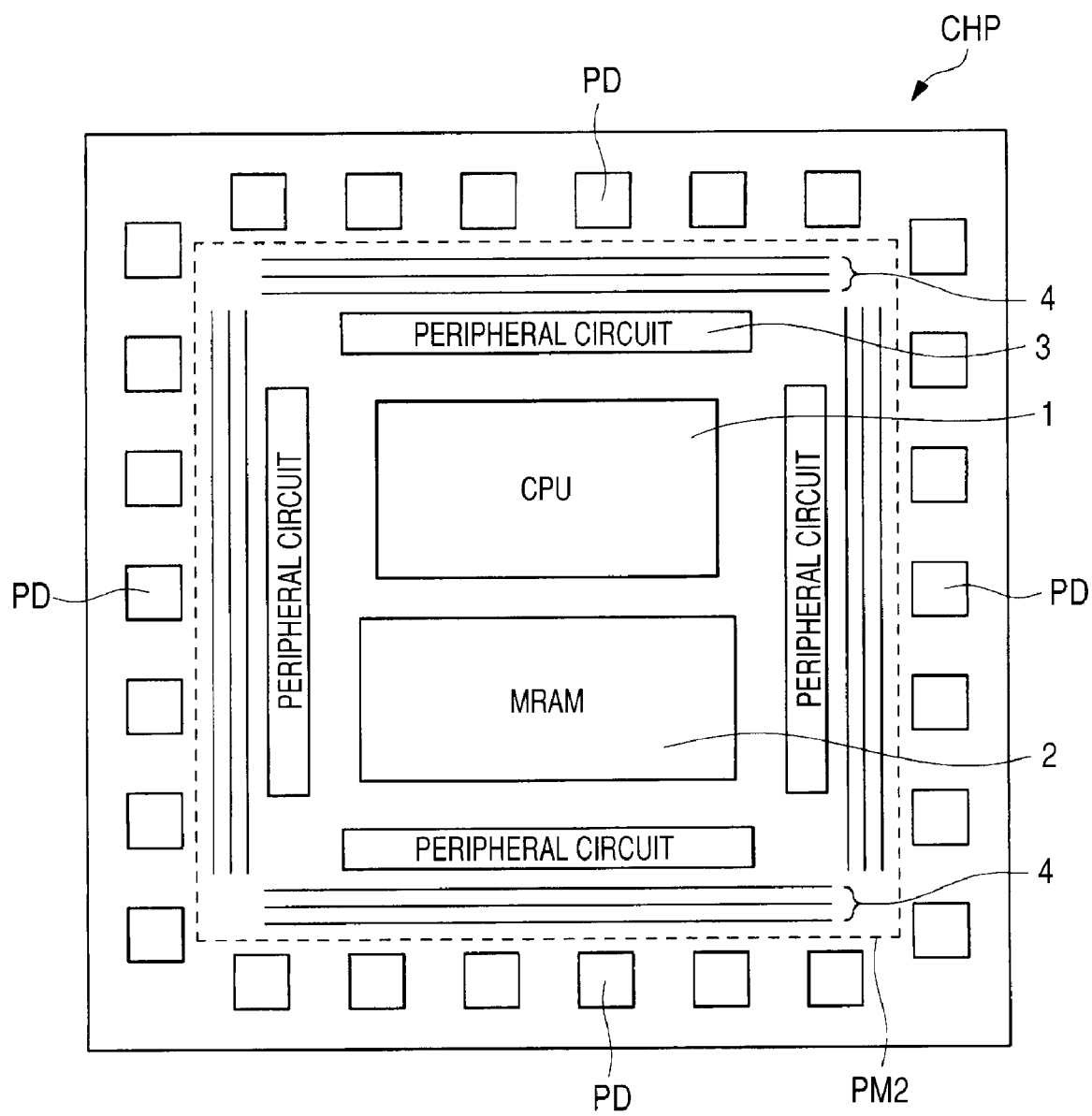
FIG. 8 shows an example of disposing a magnetic shield material over the semiconductor chip shown in FIG. 1.

FIG. 8 shows an example of disposing the magnetic shield material PM2 over the semiconductor chip CHP shown in FIG. 1. As shown in FIG. 8, the area of the magnetic shield material PM2 is smaller than the area of the principal surface of the semiconductor chip CHP. That is, the magnetic shield material PM2 is formed smaller than the area of the entire principal surface of the semiconductor chip CHP for the purpose of avoiding electrical shorting with the pad PD formed in the principal surface of the semiconductor chip CHP. At this time, the magnetic shield material PM2 may be formed so as to cover at least the formation region of the MRAM 2 formed in the principal surface of the semiconductor chip CHP. Accordingly, for example, as shown in FIG. 8, the magnetic shield material PM2 may be formed so as to cover all the CPU 1, the MRAM 2, the peripheral circuit 3, and the power line 4 that are formed on the inner side of the pad PD formed in the semiconductor chip CHP. However, for example, as shown in FIG. 9, the magnetic shield material PM2 may be disposed over the semiconductor chip CHP so that at least the region where the MRAM 2 is formed may be covered.

On the other hand, the area of the magnetic shield material PM1 formed in the rear surface of the semiconductor chip CHP may have the same size as the area of the semiconductor chip CHP (see FIG. 6). The reason is that there is no pad PD formed in the rear surface of the semiconductor chip CHP. Furthermore, the area of the magnetic shield material PM1 may be formed larger than the area of the semiconductor chip CHP.

Figure 10:
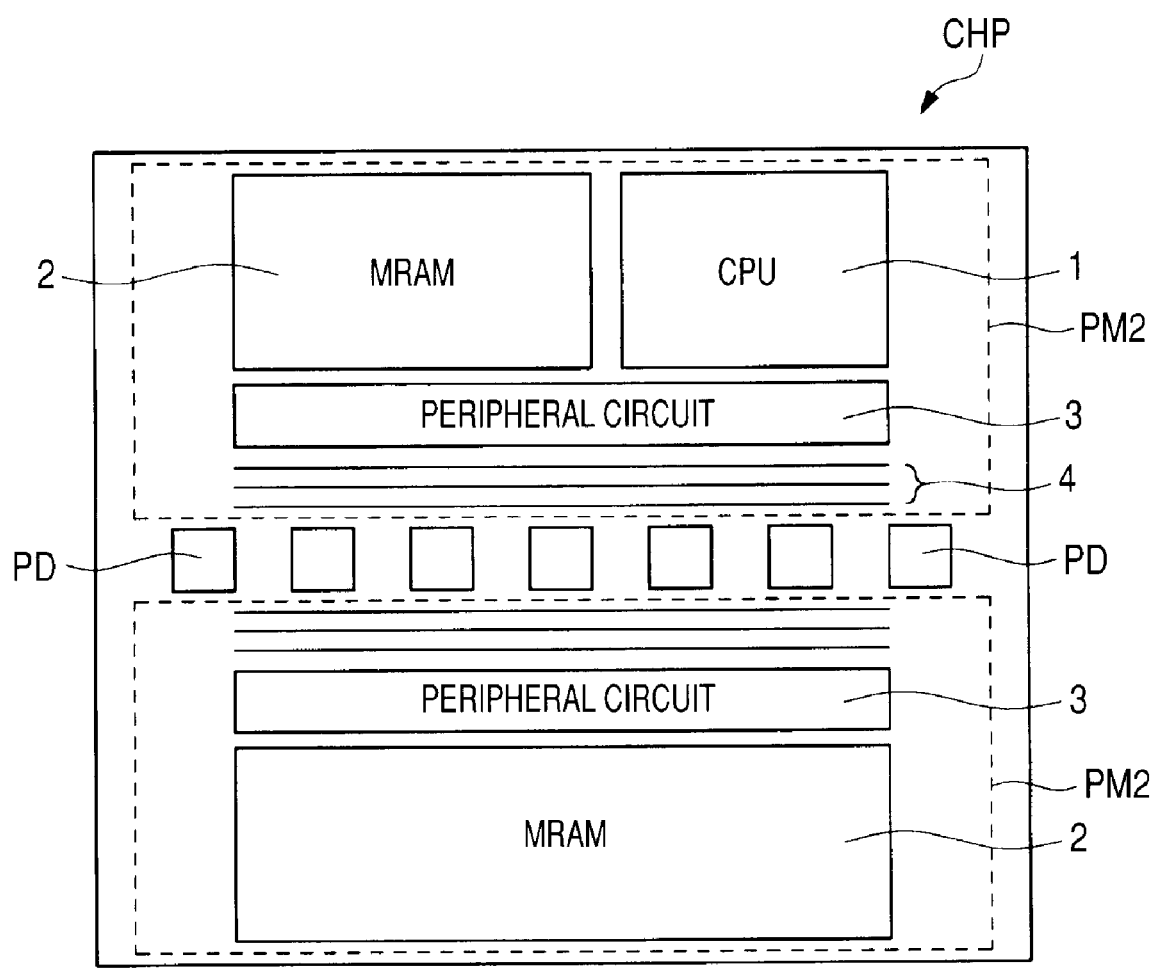
FIG. 10 shows an example of disposing a magnetic shield material over the semiconductor chip shown in FIG. 2.
Figure 11:
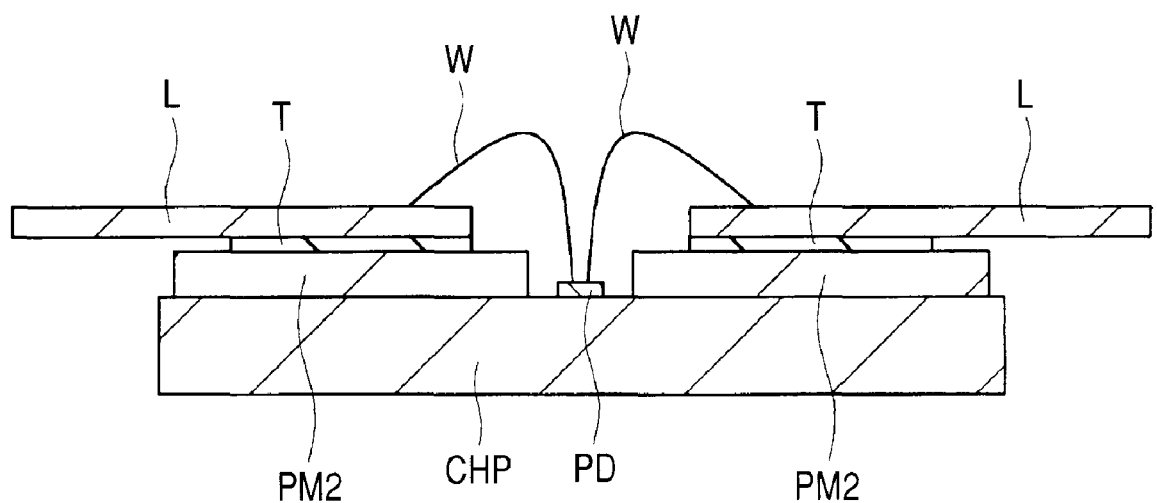
FIG. 11 is a cross sectional view showing how a pad formed in the semiconductor chip shown in FIG. 10 is coupled to a lead.

FIG. 10 shows an example of disposing the magnetic shield material PM2 over the semiconductor chip CHP shown in FIG. 2. In the semiconductor chip CHP shown in FIG. 10, there is the pad PD in the center part of the semiconductor chip CHP, and the MRAM 2 is formed on the upper and lower sides of the pad PD to sandwich the pad PD. For this reason, the magnetic shield material PM2 formed so as to cover the MRAM 2 needs to separately cover the MRAM 2 formed on the upper side of the pad PD and the MRAM 2 formed on the lower side of the pad PD, respectively, in order to avoid electrical shorting with the pad PD. Namely, the semiconductor chip CHP shown in FIG. 10 needs two magnetic shield materials PM2. FIG. 11 is a cross sectional view showing how the pad PD formed in the semiconductor chip CHP shown in FIG. 10 is coupled to the lead L. As shown in FIG. 11, the pad PD is formed in the center part of the semiconductor chip CHP, and on both sides sandwiching the pad PD the magnetic shield material PM2 is disposed. Then, over the two magnetic shield materials PM2, the lead L is formed via an adhesive tape T, respectively. The lead L and the pad PD are coupled to each other using the wire W.

Figure 9:
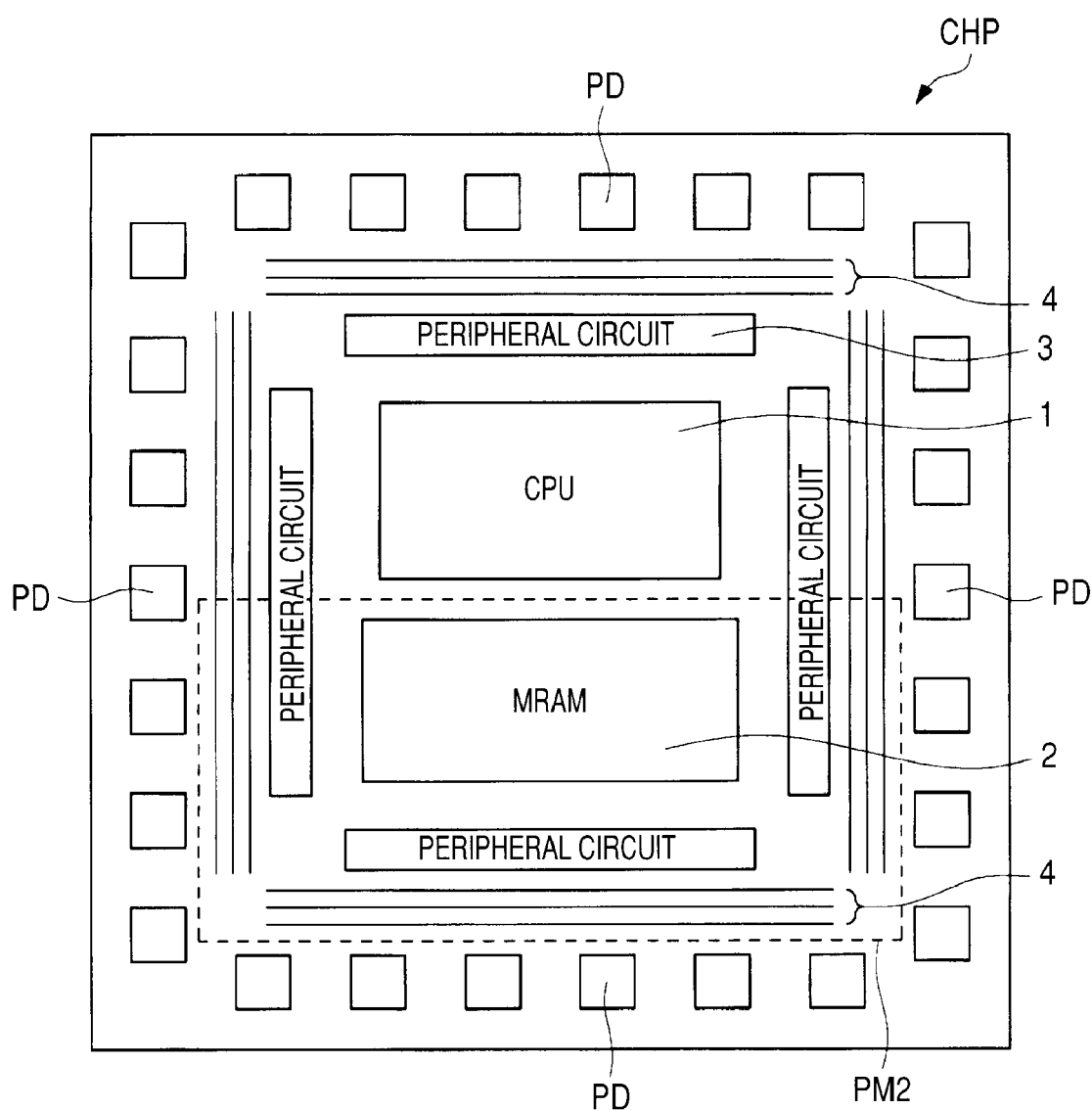
FIG. 9 shows another example of disposing a magnetic shield material over the semiconductor chip shown in FIG. 1.

As described above, also in the semiconductor chip CHP of the layouts shown in FIG. 8 and FIG. 9 or the semiconductor chip CHP of the layout shown in FIG. 10, the magnetic shield material PM2 formed on the principal surface side of the semiconductor chip CHP is smaller than the area of the principal surface of the semiconductor chip CHP. On the other hand, also in either of the semiconductor chip CHP of the layouts shown in FIG. 8 and FIG. 9 and the semiconductor chip CHP of the layout shown in FIG. 10, the pad PD is not formed in the rear surface of the semiconductor chip CHP, and therefore, the area of the magnetic shield material PM1 formed in the rear surface of the semiconductor chip CHP can be the same as the area of the rear surface of the semiconductor chip CHP or larger than the area of the rear surface of the semiconductor chip CHP. That is, the area of the magnetic shield PM2 formed over the principal surface of the semiconductor chip CHP is smaller than the area of the magnetic shield PM1 formed in the entire rear surface of the semiconductor chip CHP.

Here, the thicker the thickness of the magnetic shield material PM1 and the thickness of the magnetic shield material PM2, the greater the effect of shielding the semiconductor chip CHP from an external magnetic field becomes. This is because the thicker the thicknesses of the magnetic shield materials PM1, PM2, the greater the magnetic field (magnetic flux) absorbed by the magnetic shield materials PM1, PM2 becomes. That is, if the thicknesses of the magnetic shield materials PM1, PM2 are increased, the capacities of the magnetic shield materials PM1, PM2 to absorb magnetic fields will increase. For this reason, in view of effectively shielding the semiconductor chip CHP from an external magnetic field, the thicknesses of the magnetic shield materials PM1, PM2 are preferably increased.

However, if both the magnetic shield material PM1 and the magnetic shield material PM2 are thickened, then a problem shown below will occur. Namely, although the semiconductor chip CHP is sealed with the resin body MR, the thickness of the resin body MR is limited to not more than a predetermined value in view of reducing the size and thickness of the semiconductor device (package). Namely, the overall size and thickness of the package are required to fall within a predetermined package specification (e.g., QFP, TQFP, SOP, TSOP, and the like). In this situation, if both the thicknesses of the magnetic shield material PM1 and magnetic shield material PM2 sandwiching the semiconductor chip CHP are increased, a combined thickness of the thicknesses of the magnetic shield material PM1 and magnetic shield material PM2 becomes thicker than the thickness of the resin body MR, and the magnetic shield material PM2 will be exposed from the surface of the resin body MR. In this case, a gap is produced between the resin body MR and the magnetic shield material PM2, and moisture or foreign matters will enter the inside of the package from this gap. Then, the reliability of the package will decrease significantly. That is, in view of reducing the thickness of the package and improving the reliability thereof, it should be avoided that a total thickness of the magnetic shield material PM1 and the magnetic shield material PM2 is unduly set to a value not less than the certain value. From the above, although a total thickness of the magnetic shield material PM1 and the magnetic shield material PM2 is preferably increased in view of shielding the semiconductor chip CHP from an external magnetic field, the total thickness of the magnetic shield material PM1 and the magnetic shield material PM2 is preferably set to not more than the certain value in view of reducing the thickness of the package and improving the reliability thereof. From the above, in order to effectively shield the semiconductor chip CHP from an external magnetic field and improve the reliability of the package, the method of forming the magnetic shield material PM1 and magnetic shield material PM2 needs to be improved.

Then, in the present embodiment 1, first, we pay attention to the fact that elements such as the MRAM are formed on the principal surface side of the semiconductor chip CHP. Namely, although the semiconductor chip CHP has a certain thickness, uniform magnetic shielding is not required in the thickness direction of the semiconductor chip CHP. The elements such as the MRAM affected by an external magnetic field are formed on the principal surface side of the semiconductor chip CHP. From this fact, if a configuration capable of effectively shielding an external magnetic field on the principal surface side of the semiconductor chip CHP can be achieved, the data retention characteristic of the MRAM may be improved. That is, in the configuration of shielding the semiconductor chip CHP from an external magnetic field, an external magnetic field just needs to be effectively shielded particularly on the principal surface side of the semiconductor chip CHP in which the MRAM is formed. Taking this into account, in the present embodiment 1, as shown in FIG. 6, the thickness of the magnetic shield material PM2 is made thicker than the thickness of the magnetic shield material PM1. Thereby, the thickness of the magnetic shield material PM2 disposed on the principal surface side of the semiconductor chip CHP is increased. As a result, the capacity of the magnetic shield material PM2 to absorb magnetic fields can be increased, and the MRAM forming region on the principal surface side of the semiconductor chip CHP can be effectively shielded from an external magnetic field. Namely, since the MRAM susceptible to an external magnetic field is formed on the principal surface side of the semiconductor chip CHP, the magnetic shield effect on the principal surface side of the semiconductor chip CHP is improved by increasing the thickness of the magnetic shield material PM2 disposed over the principal surface of the semiconductor chip CHP. On the other hand, since elements such as the MRAM are not formed in the rear surface of the semiconductor chip CHP, the thickness of the magnetic shield material PM1 needs not to be increased sufficiently. Accordingly, the thickness of the magnetic shield material PM1 disposed in the rear surface of the semiconductor chip CHP can be formed with a necessary minimum thickness. Thus, the configuration of the present embodiment 1 is characterized in that, the thickness of the magnetic shield material PM2 is made thicker than the thickness of the magnetic shield material PM1, on the assumption that the area of the magnetic shield material PM2 disposed over the principal surface of the semiconductor chip CHP is made smaller than that of the principal surface of the semiconductor chip CHP and that the area of the magnetic shield material PM1 disposed in the rear surface of the semiconductor chip CHP is made not less than that of the rear surface of the semiconductor chip CHP.

Thereby, the MRAM formed on the principal surface side of the semiconductor chip CHP can be effectively shielded from an external magnetic field, and since the thickness of the magnetic shield material PM1 is made thin as compared with the thickness of the magnetic shield material PM2, a total thickness of the magnetic shield material PM1 and the magnetic shield material PM2 can be reduced to not more than the certain value. As a result, according to the semiconductor device in the present embodiment 1, the semiconductor chip CHP can be shielded from an external magnetic field and the reliability of the package can be improved.

Note that, although the area of the magnetic shield material PM2 disposed over the principal surface of the semiconductor chip CHP is preferably as large as possible, the magnetic shield material PM2 needs to be formed so as to cover at least a region, where the MRAM is formed, in the principal surface of the semiconductor chip CHP. This is because an external magnetic field needs to be shielded most effectively in the region where the MRAM is formed.

As described above, one of the features of the present embodiment 1 is in that the thickness of the magnetic shield material PM2 is made thicker than that of the magnetic shield material PM1 on the assumption that the area of the magnetic shield material PM2 is smaller than that of the magnetic shield material PM1. Furthermore, the magnetic shield effect is improved by devising the quality of the material of the magnetic shield materials PM1, PM2. Namely, for the magnetic shield materials PM1, PM2, a 42 alloy that is an alloy of nickel and iron can be used, for example, however, the 42 alloy cannot sufficiently improve the magnetic shield effect. For this reason, in the present embodiment 1, permalloy that is an alloy of nickel and iron is used as the magnetic shield materials PM1, PM2. Although permalloy is a material close to the 42 alloy, which is also an alloy of nickel and iron, in terms of the mechanical physical properties, permalloy is a material with an improved magnetic characteristic due to a change in the mixing ratio of nickel and iron, a change in the heat treatment condition, or the like. For this reason, the effect of shielding an external magnetic field can be improved using permalloy for the magnetic shield materials PM1, PM2.

More particularly, a PC permalloy, a PB permalloy, and permendur or a pure iron can be used as the magnetic shield materials PM1, PM2. The PC permalloy is an alloy comprising iron (Fe) 17%, nickel (Ni) 79%, and molybdenum (Mo) 4% while the PB permalloy is an alloy comprising iron (Fe) 54% and nickel (Ni) 46%. On the other hand, the permendur is an alloy comprising iron (Fe) 49%, cobalt (Co) 49%, and vanadium (V) 2%. Comparison of the PC permalloy, the PB permalloy, the permendur, and a pure iron shows that the PC permalloy has a property likely to be magnetized with the lowest strength of magnetic field (e.g., the strength of magnetic field of around 1H (A/m) or more). Accordingly, in the present embodiment 1, in view of good response and sensitivity to a weak magnetic field and also in view of promptly absorbing a relatively weak magnetism that may cause a problem at the assembly level and exhibiting a sufficient shielding effect, the PC permalloy or the PB permalloy is preferably used for the magnetic shield materials PM1, PM2. Thus, in the magnetic shield materials PM1, PM2 in the present embodiment 1, the PC permalloy or the PB permalloy is used. On the other hand, although the permendur or a pure iron may be used as the magnetic shield materials PM1, PM2, it has a property unlikely to be magnetized in a relatively weak magnetic field. Therefore, in view of sufficiently obtaining a shielding effect with respect to a relatively strong magnetic field (of no less than 10H to 100H), the permendur or pure iron having a high capacity to absorb magnetic fields may be used.

Figure 12:
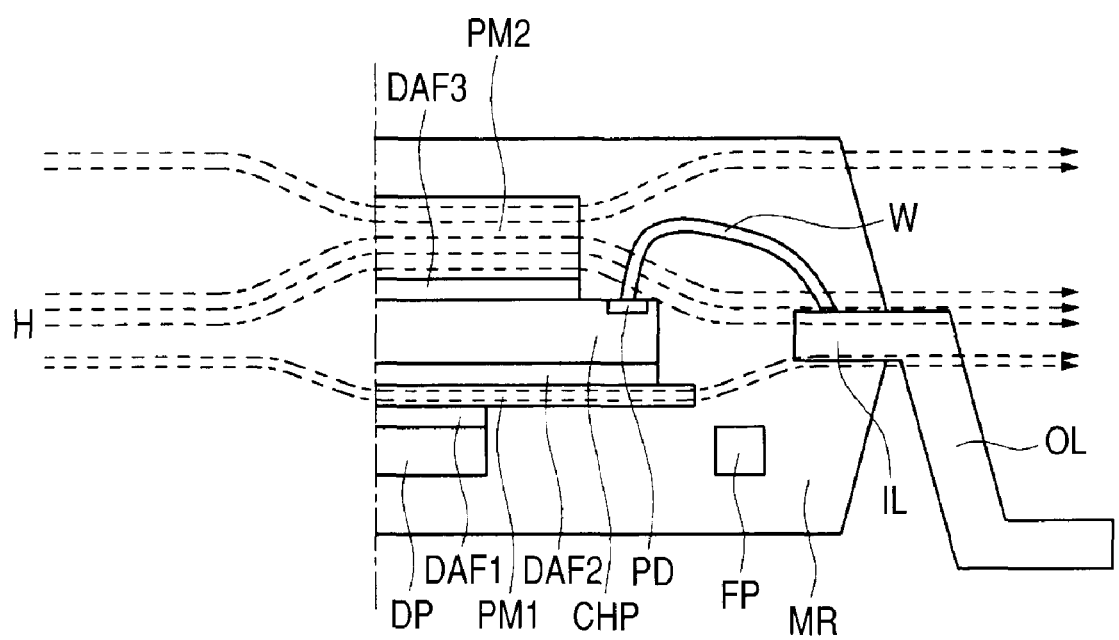
FIG. 12 is a schematic view showing a state where a semiconductor chip is shielded by the magnetic shield material in the package in the embodiment 1.

FIG. 12 shows a state where the semiconductor chip CHP is shielded from an external magnetic field by sandwiching the semiconductor chip CHP with the magnetic shield material PM1 and the magnetic shield material PM2. In FIG. 12, for purposes of clarity, only the right half of the package is illustrated. As shown in FIG. 12, assume an external magnetic field H is applied in the horizontal direction. In this case, the external magnetic field H passes through the inside of the magnetic shield material PM1 or magnetic shield material PM2 without passing through the semiconductor chip CHP. Namely, the external magnetic field H, which is supposed to pass through the inside of the semiconductor chip CHP, is absorbed by the magnetic shield materials PM1, PM2. In particular, since the thickness of the magnetic shield material PM2 disposed on the principal surface side (upper surface side) of the semiconductor chip CHP is thicker than the thickness of the magnetic shield material PM1 disposed on the rear surface side of the semiconductor chip CHP, more external magnetic field H is absorbed in the inside of the magnetic shield material PM2. Accordingly, on the principal surface side of the semiconductor chip CHP, the external magnetic field can be effectively shielded.

Figure 13:
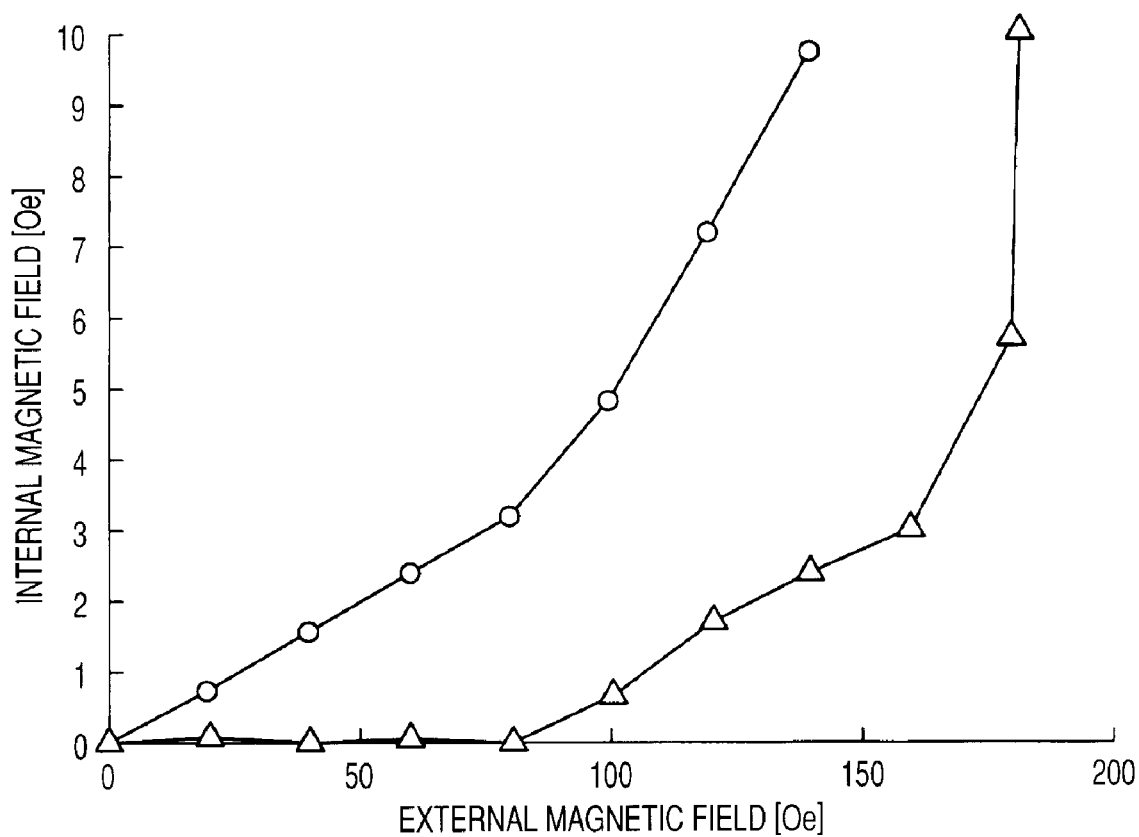
FIG. 13 is a graph showing a relationship between an external magnetic field existing outside a semiconductor chip and an internal magnetic field entering the inside of the semiconductor chip, the graph comparing a shielding effect of a comparative example with that in the embodiment 1.

Next, an improvement of the magnetic shield effect by forming the thickness of the magnetic shield material PM2 thicker than that of the magnetic shield material PM1 is described. FIG. 13 is a graph showing a relationship between an external magnetic field generated outside the semiconductor chip CHP and an internal magnetic field entering the inside of the semiconductor chip CHP. In FIG. 13, the external magnetic field is a magnetic field generated outside the semiconductor chip CHP and the internal magnetic field is a magnetic field generated inside the semiconductor chip CHP by the external magnetic field. Accordingly, an increase in the magnetic shield effect means that the internal magnetic field is sufficiently reduced even if the same external magnetic field is applied.

In FIG. 13, the horizontal axis shows the magnitude (Oe: oersted) of the external magnetic field while the vertical axis shows the magnitude (Oe: oersted) of the internal magnetic field. First, the graph of a comparative example is described. The comparative example indicates a case where the thicknesses of the magnetic shield material PM1 and magnetic shield material PM2 sandwiching the semiconductor chip CHP are set to the same 100 μm and both of the magnetic shield materials PM1, PM2 are formed from the 42 alloy material. In FIG. 13, the comparative example is plotted with a white circle. For example, in the comparative example, the magnitude of the internal magnetic field is approximately 5 (Oe) when the magnitude of the external magnetic field is 100 (Oe).

Subsequently, the graph of the present embodiment 1 is described. The present embodiment 1 refers to a case where the thicknesses of the magnetic shield material PM1 and magnetic shield material PM2 sandwiching the semiconductor chip CHP are made different from each other and the magnetic shield materials PM1, PM2 are formed from permalloy. Specifically, the thickness of the magnetic shield material PM2 disposed over the principal surface of the semiconductor chip CHP is set to 200 μm while the thickness of the magnetic shield material PM1 disposed in the rear surface of the semiconductor chip CHP is set to 100 μm. In FIG. 13, the present embodiment 1 is plotted with a white triangle. As shown in FIG. 13, in the present embodiment 1, for example, the magnitude of the internal magnetic field is approximately 1 Oe (oersted) when the magnitude of the external magnetic field is 100 Oe (oersted).

From the above, comparison between the present embodiment 1 and the comparative example shows that for example, when the external magnetic field of the same 100 Oe (oersted) is applied, the magnitude of the internal magnetic field is 5 Oe (oersted) in the comparative example while in the present embodiment 1 the magnitude of the internal magnetic field is 1 Oe (oersted). Namely, even if the external magnetic field of the same magnitude is applied, the magnitude of the internal magnetic field in the present embodiment 1 is extremely smaller than that in the comparative example. This indicates that the effect of shielding an external magnetic field in the present embodiment 1 is higher than that in the comparative example. Accordingly, as with the present embodiment 1, by forming the thickness of the magnetic shield material PM2 disposed over the principal surface of the semiconductor chip CHP thicker than that of the magnetic shield material PM1 disposed in the rear surface of the semiconductor chip CHP, and furthermore by forming the magnetic shield materials PM1, PM2 from permalloy, the magnetic shield effect can be improved. As a result, according to the package (semiconductor device) in the present embodiment 1, the data retention characteristic of the MRAM can be improved because the magnetic shield effect on the semiconductor chip CHP can be improved. Furthermore, according to the present embodiment 1, a reduction in the thickness of the package and an improvement in the reliability thereof can be also achieved because the thickness of the magnetic shield material PM1 disposed in the rear surface of the semiconductor chip CHP can be reduced.

Figure 14:
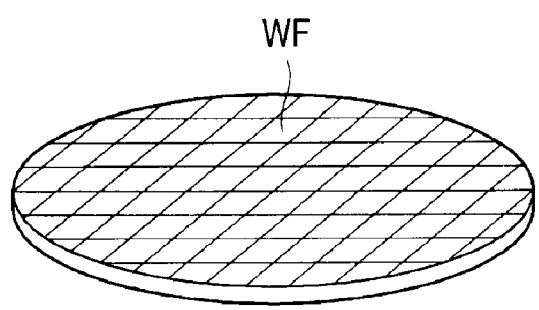
FIG. 14 is a perspective view showing a manufacturing process of a semiconductor device (package) in the embodiment 1.

The semiconductor device (package) in the present embodiment 1 is configured as described above, and now a method of manufacturing the same is described with reference to the accompanying drawings. First, a semiconductor wafer WF is prepared as shown in FIG. 14. An integrated circuit comprising an MRAM, an MISFET, and wirings is formed on the principal surface side (upper surface side) of the semiconductor wafer WF. The method of forming the integrated circuit over the principal surface of the semiconductor wafer WF can be implemented using an ordinary semiconductor manufacturing technology. In the semiconductor wafer WF, a plurality of chip areas is formed in an array, and a microcomputer shown by the layout of FIG. 1 or FIG. 2 is formed in the individual chip area.

Figure 15:
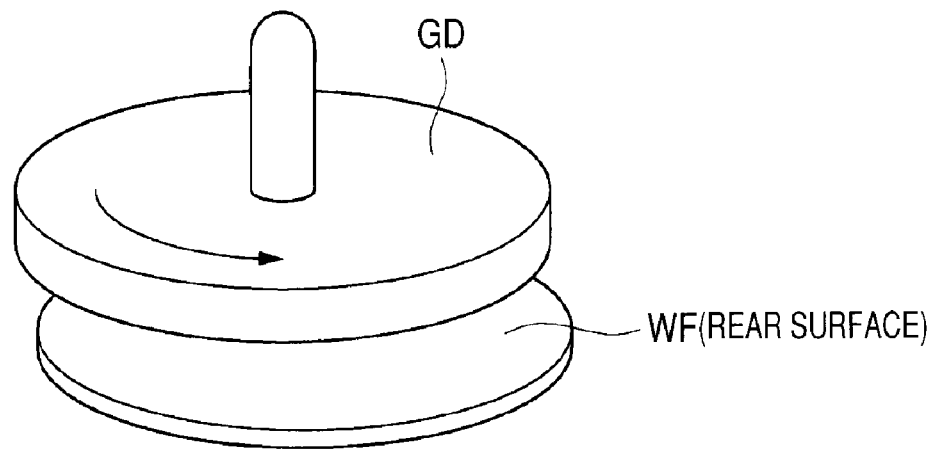
FIG. 15 is a perspective view showing a manufacturing process of the semiconductor device following the manufacturing process of FIG. 14.

Subsequently, the rear surface of the semiconductor wafer WF is ground by a grinder GD as shown in FIG. 15. In this manner, the thickness of the semiconductor wafer WF can be reduced. Since the integrated circuit comprising the MRAM is formed in the principal surface of the semiconductor wafer WF, the grinding is implemented in the rear surface of the semiconductor wafer WF in which the integrated circuit is not formed.

Figure 16:
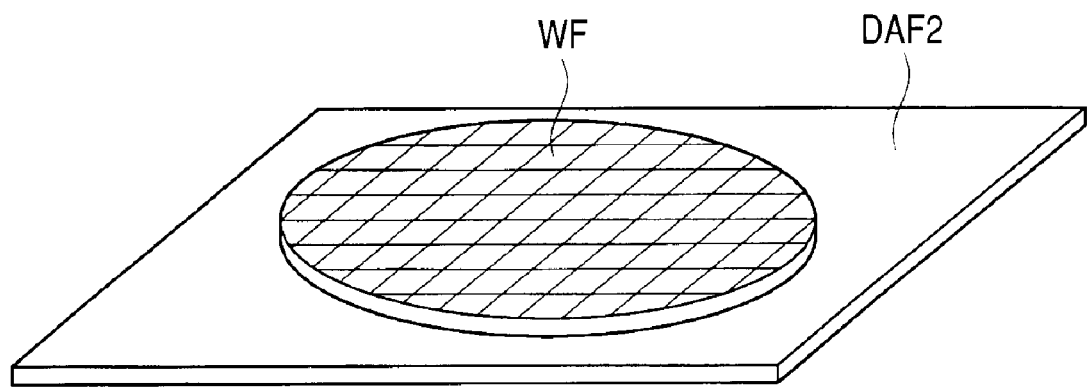
FIG. 16 is a perspective view showing a manufacturing process of the semiconductor device following the manufacturing process of FIG. 15.
Figure 17:
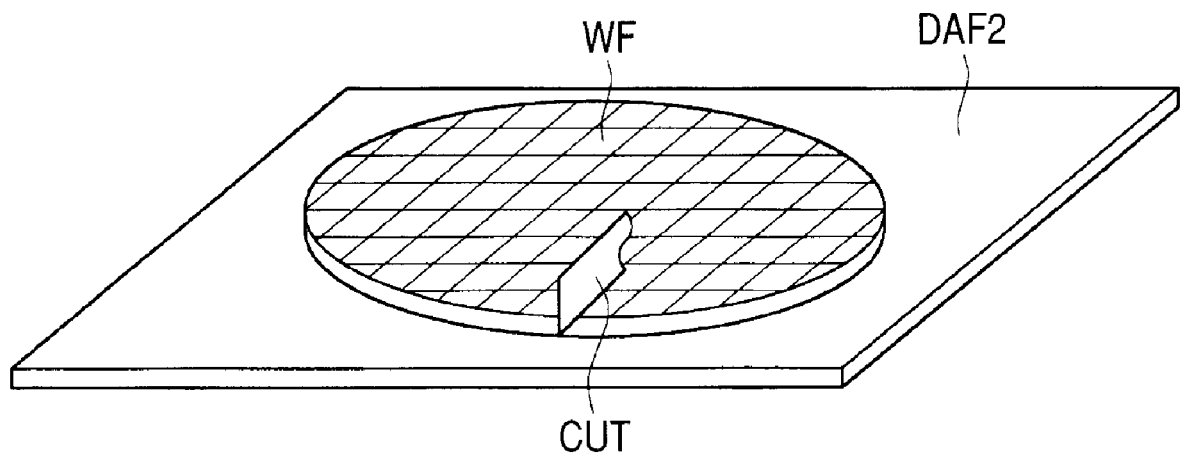
FIG. 17 is a perspective view showing a manufacturing process of the semiconductor device following the manufacturing process of FIG. 16.
Figure 18:
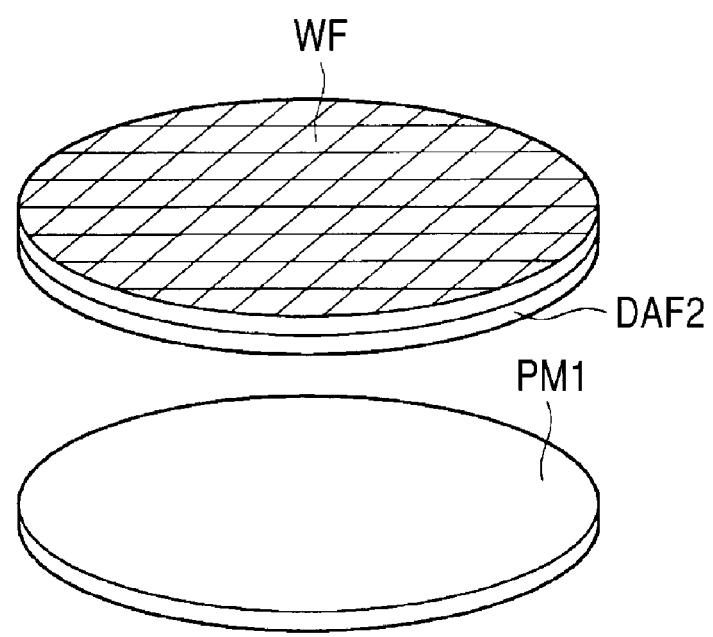
FIG. 18 is a perspective view showing a manufacturing process of the semiconductor device following the manufacturing process of FIG. 17.
Figure 19:
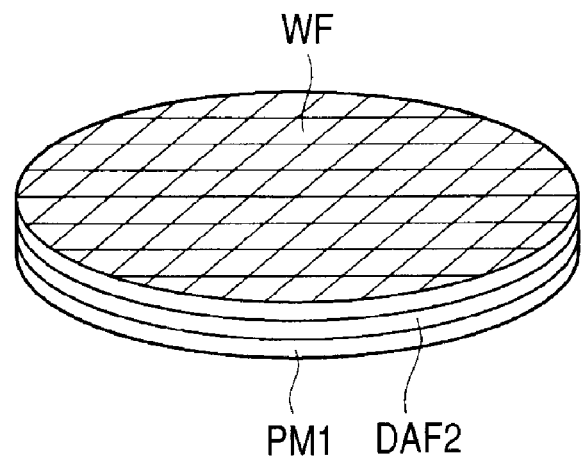
FIG. 19 is a perspective view showing a manufacturing process of the semiconductor device following the manufacturing process of FIG. 18.

Next, after implementing a reduction in the thickness of the semiconductor wafer WF, a tabular die attach film DAF2 is stuck to the rear surface of the semiconductor wafer WF as shown in FIG. 16. Then, as shown in FIG. 17, the tabular die attach film DAF2 is cut along the contour of the semiconductor wafer WF using a cutter CUT. Subsequently, as shown in FIG. 18, the magnetic shield material PM1 having the same planar shape as that of the semiconductor wafer WF is prepared, and then, as shown in FIG. 19, the magnetic shield material PM1 having the same shape as that of the semiconductor wafer WF is stuck to the surface opposite to the surface of the semiconductor wafer WF to which the die attach film DAF2 is stuck. The magnetic shield material PM1 is formed from permalloy comprising an alloy of nickel and iron, for example. Note that, in the present embodiment 1, an example using the magnetic shield material PM1 having the same planar shape as that of the semiconductor WF is described, however, the planar shape of the magnetic shield material PM1 is not limited thereto and may be square, for example.

Figure 20:
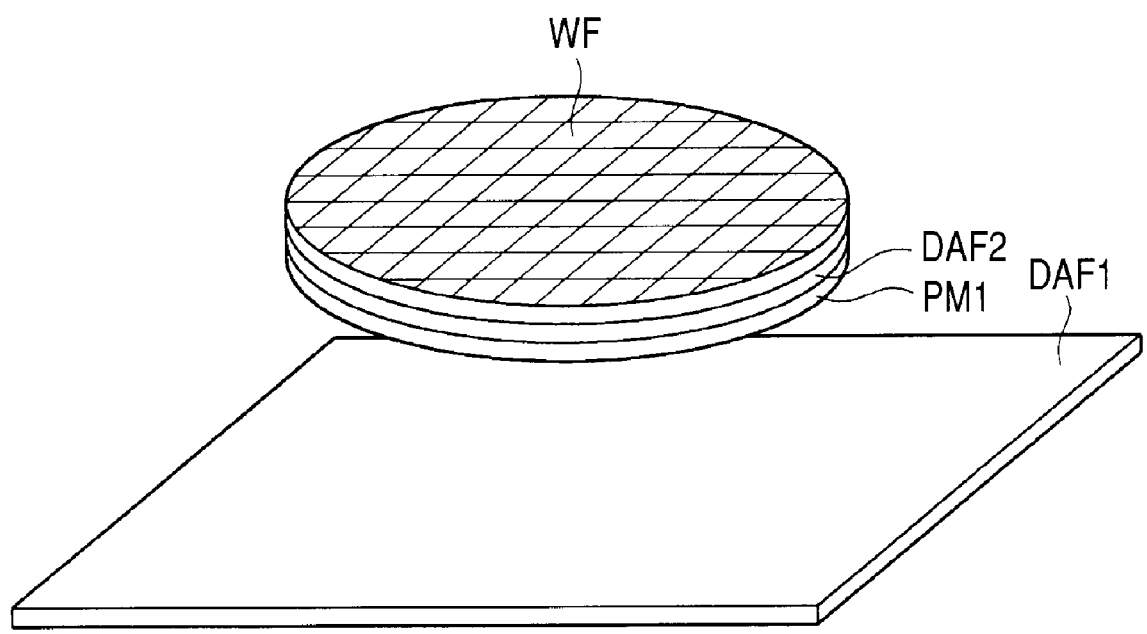
FIG. 20 is a perspective view showing a manufacturing process of the semiconductor device following the manufacturing process of FIG. 19.
Figure 21:
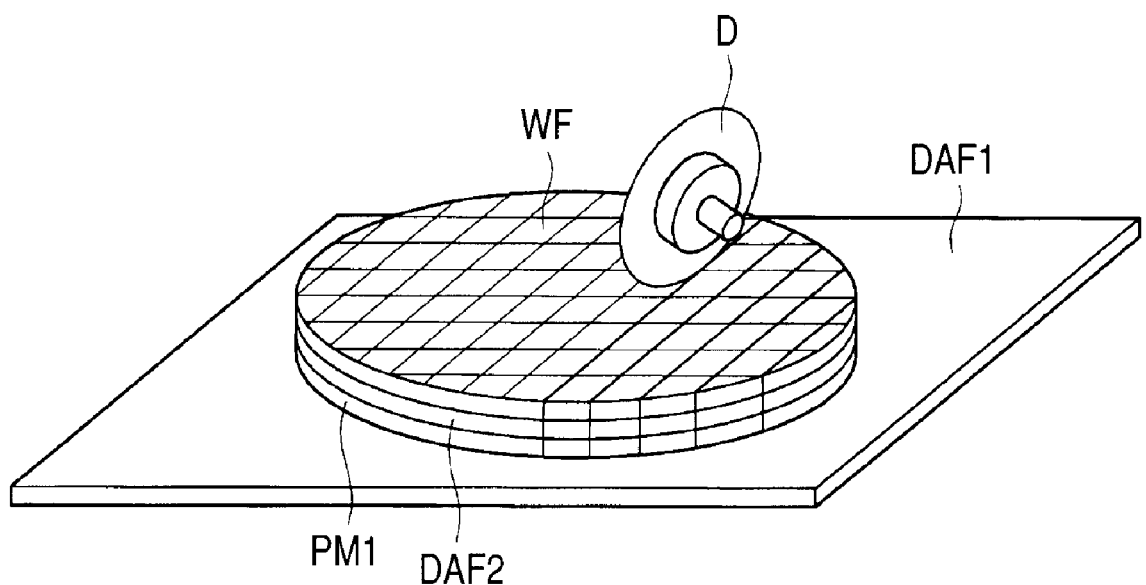
FIG. 21 is a perspective view showing a manufacturing process of the semiconductor device following the manufacturing process of FIG. 20.
Figure 22:
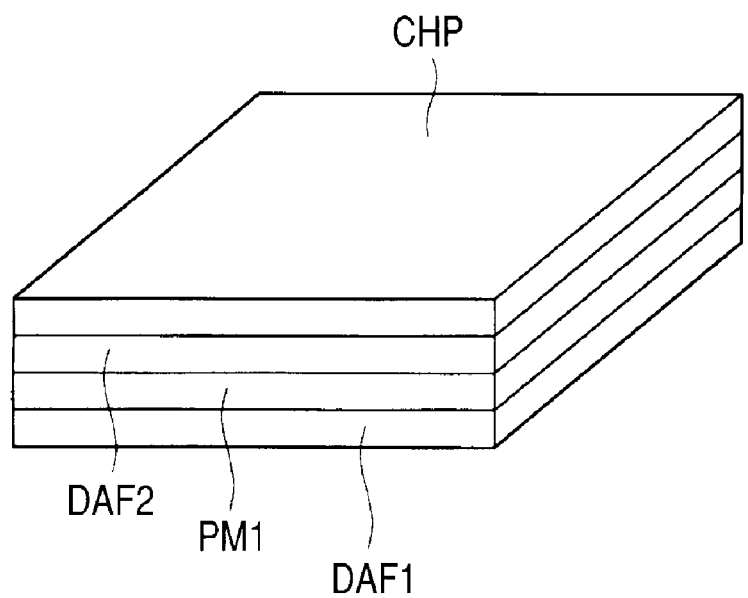
FIG. 22 is a perspective view showing a manufacturing process of the semiconductor device following the manufacturing process of FIG. 21.

Subsequently, as shown in FIG. 20, the tabular die attach film DAF1 is stuck to the rear surface of the magnetic shield material PM1 that is stuck to the semiconductor wafer WF via the die attach film DAF2. Then, as shown in FIG. 21, the semiconductor wafer WF and the magnetic shield material PM1 are integrated with each other and diced by a dicer D. Thus, as shown in FIG. 22, the chip area of the semiconductor wafer WF is singulated and the semiconductor chip CHP can be acquired. The magnetic shield material PM1 is stuck to the semiconductor chip CHP via the die attach film DAF2, and furthermore, the die attach film DAF1 is stuck to the magnetic shield material PM1. Here, the semiconductor chip CHP to which the magnetic shield material PM1 is stuck is acquired by dicing the semiconductor wafer WF while the magnetic shield material PM1 is being stuck to the semiconductor wafer WF. However, the semiconductor chip CHP may be acquired by dicing the semiconductor wafer WF without the magnetic shield material PM1 stuck thereto and then the magnetic shield material PM1 may be stuck to the acquired semiconductor chip CHP.

Figure 23:
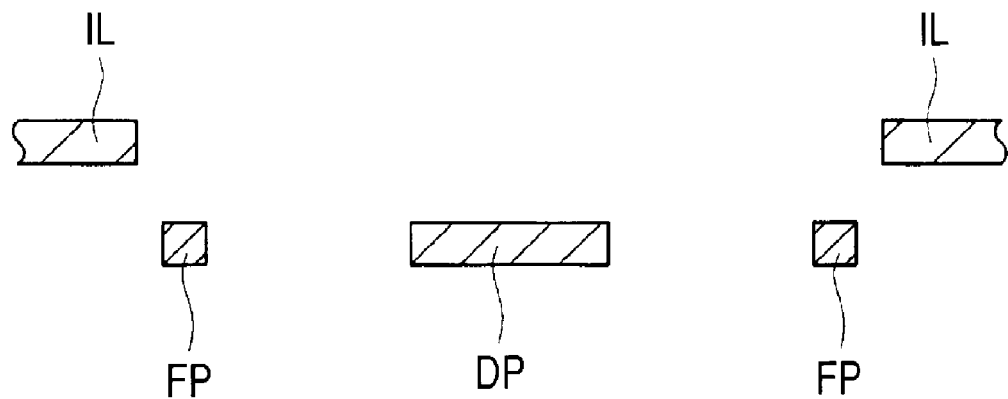
FIG. 23 is a cross sectional view showing a manufacturing process of the semiconductor device following the manufacturing process of FIG. 22.
Figure 24:
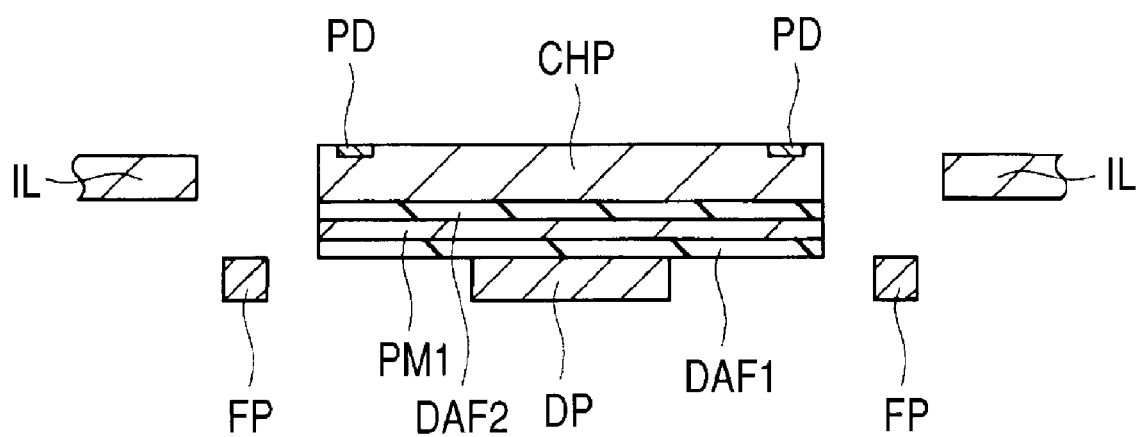
FIG. 24 is a cross sectional view showing a manufacturing process of the semiconductor device following the manufacturing process of FIG. 23.

Next, as shown in FIG. 23, a lead frame is prepared. The lead frame comprises the die pad DP, the frame FP, and the inner lead IL. Then, as shown in FIG. 24, the semiconductor chip CHP integrated with the magnetic shield material PM1 is mounted over the die pad DP of the lead frame. At this time, with the die attach film DAFT stuck to the rear surface of the magnetic shield material PM1, the magnetic shield material PM1 and the die pad DP are bonded to each other.

Figure 25:
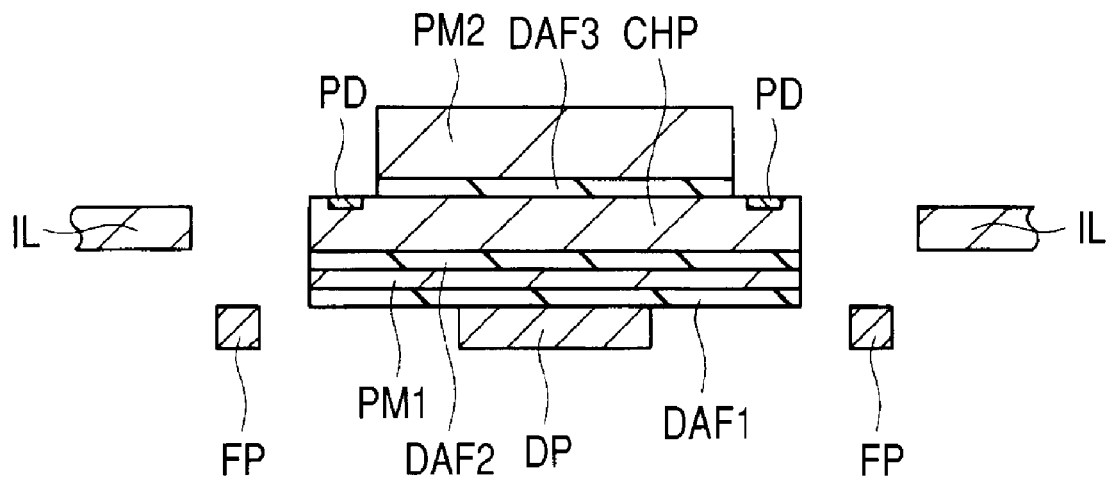
FIG. 25 is a cross sectional view showing a manufacturing process of the semiconductor device following the manufacturing process of FIG. 24.

Subsequently, as shown in FIG. 25, the magnetic shield material PM2 is bonded over the principal surface of the semiconductor chip CHP. At this time, the die attach film DAF3 is already stuck to the magnetic shield material PM2, and the magnetic shield material PM2 is bonded over the principal surface of the semiconductor chip CHP via the die attach film DAF3. The magnetic shield material PM2 is adapted not to overlap in a planar view with the pad PD formed over the principal surface of the semiconductor chip CHP. As a result, the area of the magnetic shield material PM2 is smaller than that of the magnetic shield material PM1. Then, furthermore, the thickness of the magnetic shield material PM2 is thicker than that of the magnetic shield material PM1. Therefore, on the principal surface side of the semiconductor chip CHP in which the MRAM is formed, the magnetic shield effect increases and the shielding the MRAM from an external magnetic field can be effectively performed.

Figure 26:
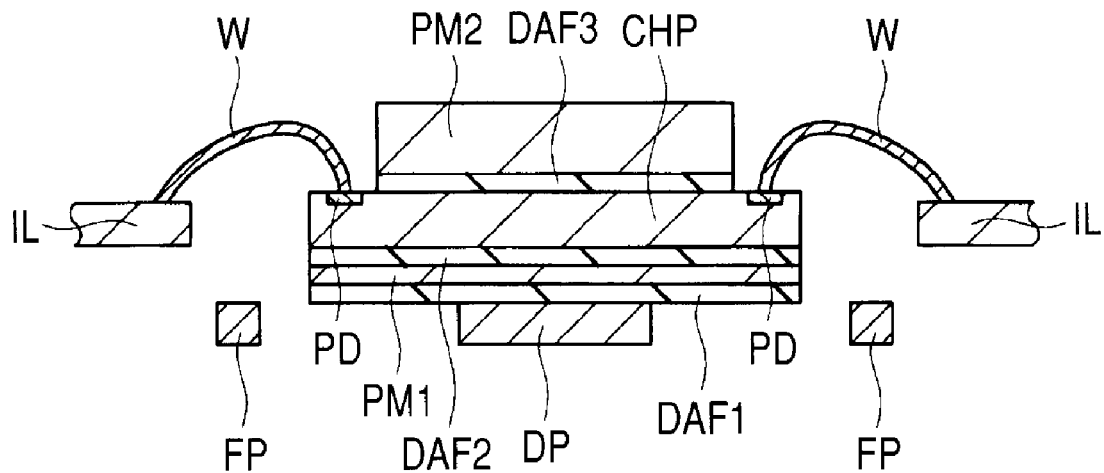
FIG. 26 is a cross sectional view showing a manufacturing process of the semiconductor device following the manufacturing process of FIG. 25.
Figure 27:
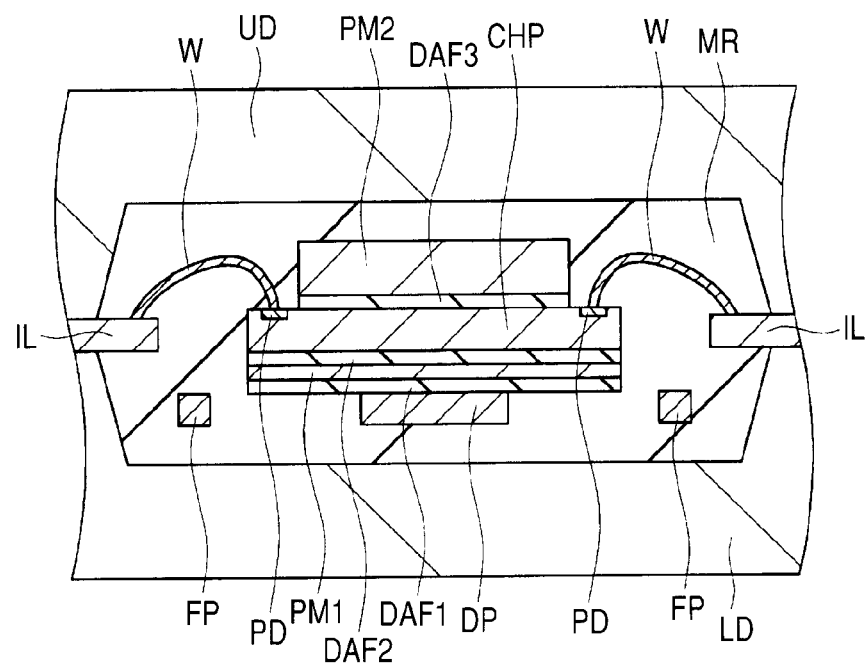
FIG. 27 is a cross sectional view showing a manufacturing process of the semiconductor device following the manufacturing process of FIG. 26.

Next, as shown in FIG. 26, the pad PD formed over the principal surface of the semiconductor chip CHP and the inner lead IL of the lead frame are electrically coupled to each other using the wire W (wire bonding). Subsequently, as shown in FIG. 27, the lead frame is sandwiched by an upper die UD and a lower die LD, and then a resin is injected therein so as to cover the semiconductor chip CHP, thereby forming the resin body MR. Specifically, the inner lead IL, the die pad DP, the wire W, the die attach films DAFT to DAF3, the magnetic shield materials PM1, PM2, and the semiconductor chip CHP are sealed with the resin body MR, and the package (semiconductor device) as shown in FIG. 6 can be manufactured.

Embodiment 2

Figure 28:
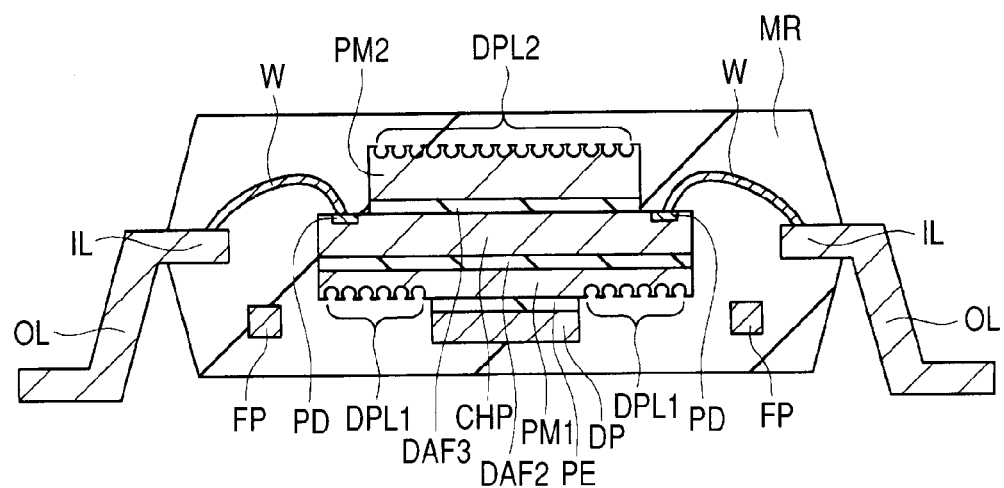
FIG. 28 is a cross sectional view showing a configuration of a semiconductor device in an embodiment 2.

A semiconductor device (package) in the present embodiment 2 will be described with reference to the accompanying drawings. FIG. 28 is a cross sectional view showing the configuration of the semiconductor device in the present embodiment 2. The configuration of the semiconductor device in the present embodiment 2 shown in FIG. 28 is almost the same as that of the semiconductor device in the above-described embodiment 1 shown in FIG. 6. Namely, also in the present embodiment 2, the thickness of the magnetic shield material PM2 disposed over the principal surface of the semiconductor chip CHP is formed thicker than that of the magnetic shield material PM1 disposed in the rear surface of the semiconductor chip CHP, and the magnetic shield materials PM1, PM2 comprise permalloy. Thereby, the magnetic shield effect can be improved.

On the other hand, a difference between the present embodiment 2 and the embodiment 1 is in that in the present embodiment 2, dimples are formed in the surfaces of the magnetic shield material PM1 and magnetic shield material PM2. Although the magnetic shield materials PM1, PM2 comprise permalloy that is an alloy of nickel and iron, for example, this permalloy also does not have such excellent adhesion with the resin body MR. For this reason, after manufacturing the package, in the step of bonding the finished package to a mounting substrate with solder, a reflow treatment is implemented. However, permalloy and the sealing resin body MR may separate from each other in this reflow treatment. Then, in the present embodiment 2, a plurality of dimples DPL1 is formed in the surface of the magnetic shield material PM1, and a plurality of dimples DPL2 is formed in the surface of the magnetic shield material PM2. Since the dimples DPL1, DPL2 are formed in the surfaces of the magnetic shield materials PM1, PM2 in this manner, the resin body MR will be injected even into the insides of these dimples DPL1, DPL2. Accordingly, because of an anchor effect due to the resin body MR entering the insides of the dimples DPL1, DPL2 and an effect of an increase in the contact area (surface area) between the respective magnetic shield materials PM1, PM2 and the resin body MR due to the forming of the dimples DPL1, DPL2, the adhesive strength between the respective magnetic shield materials PM1, PM2 and the resin body MR will improve. For this reason, even in the reflow treatment, separation of the respective magnetic shield materials PM1, PM2 from the resin body MR can be suppressed, and the reliability of the package can be improved.

As described above, also in the present embodiment 2, the shielding effect of the MRAM from an external magnetic field can be improved, and a further improvement in the reliability of the package can be achieved.

Figure 29:
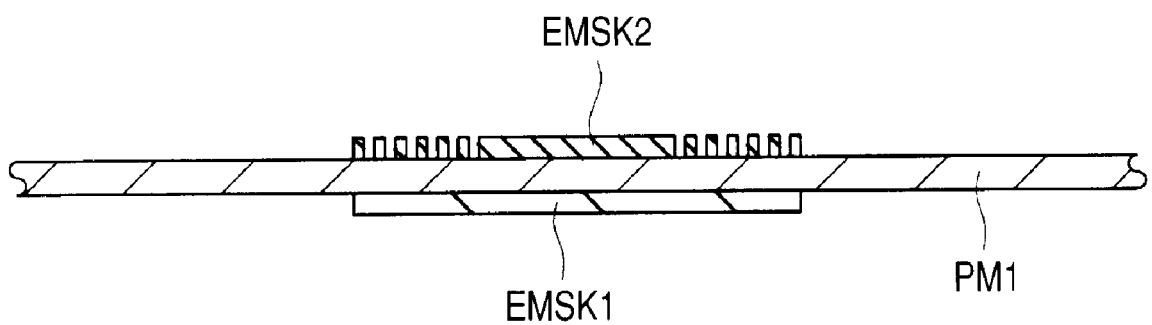
FIG. 29 is a cross sectional view showing a manufacturing process of a magnetic shield material.
Figure 30:
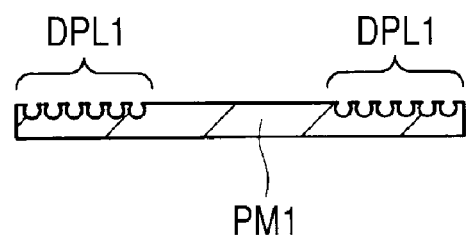
FIG. 30 is a cross sectional view showing a manufacturing process of the magnetic shield material following the manufacturing process of FIG. 29.

The package in the present embodiment 2 is configured as described above, and now a method of manufacturing the same is described with reference to the accompanying drawings. First, an example of a method of forming the magnetic shield material PM1 is described using FIG. 29 and FIG. 30. As shown in FIG. 29, the tabular magnetic shield material PM1 is prepared. Then, a mask is formed on the upper and lower sides of the magnetic shield material PM1, respectively. Specifically, a mask EMSK1 that is a light shielding pattern with no hole is formed on the lower side of the magnetic shield material PM1, while on the upper side of the magnetic shield material PM1, a mask EMSK2 with holes is disposed. After disposing the masks EMSK1, EMSK2 on the upper and lower sides of the magnetic shield material PM1 in this manner, the magnetic shield material PM1 is etched using these masks EMSK1, EMSK2. This etching is wet etching using an etchant, for example. Thereby, a plurality of singulated magnetic shield materials PM1 is formed and also a plurality of dimples DPL1 is formed in the surface of the magnetic shield material PM1, as shown in FIG. 30. Note that, in the surface of the magnetic shield material PM1, in a region adhering to the die pad DP the dimple DPL1 is not formed. This is because adhesion between the magnetic shield material PM1 and the die pad DP can be further improved when the magnetic shield material PM1 has high flatness.

Figure 31:
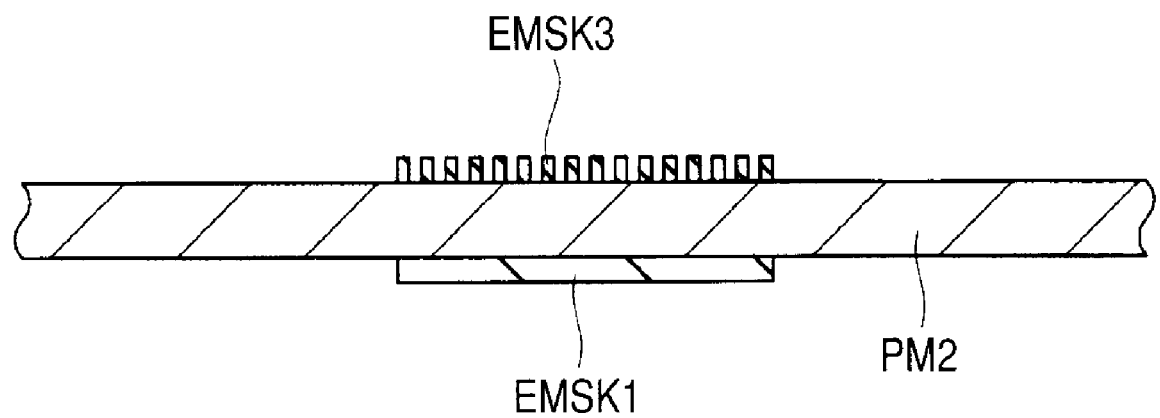
FIG. 31 is a cross sectional view showing a manufacturing process of a magnetic shield material.
Figure 32:
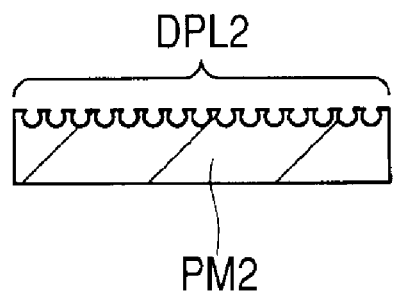
FIG. 32 is a cross sectional view showing a manufacturing process of the magnetic shield material following the manufacturing process of FIG. 31.

Likewise, an example of a method of forming the magnetic shield material PM2 is described with reference to FIG. 31 and FIG. 32. As shown in FIG. 31, the tabular magnetic shield material PM2 is prepared. Then, a mask is formed on the upper and lower sides of the magnetic shield material PM2, respectively. Specifically, the mask EMSK1 that is a light shielding pattern with no hole is formed on the lower side of the magnetic shield material PM2, while on the upper side of the magnetic shield material PM2, a mask EMSK3 with holes is disposed. After disposing the masks EMSK1, EMSK3 on the upper and lower sides of the magnetic shield material PM2 in this manner, the magnetic shield material PM2 is etched using these masks EMSK1, EMSK3. This etching is wet etching using an etchant, for example. Thereby, a plurality of singulated magnetic shield materials PM2 is formed and also a plurality of dimples DPL2 is formed in the surface of the magnetic shield material PM2, as shown in FIG. 32.

In this manner, the magnetic shield material PM1 in which the dimples DPL1 are formed and the magnetic shield material PM2 in which the dimples DPL2 are formed can be formed. Here, although the dimples DPL1 and the DPL2 are formed in the magnetic shield materials PM1, PM2, a plurality of through-holes in place of the dimples DPL1, DPL2 may be formed. Namely, even if the through-holes are formed in the magnetic shield materials PM1, PM2, since the resin body MR will enter these through-holes, the anchor effect and the effect of an improvement in adhesion due to an increase of the surface area may be obtained.

However, in the present embodiment 2, the dimples DPL1, DPL2 are formed without forming a through-hole in the magnetic shield materials PM1, PM2. This is because if throughholes are formed in the magnetic shield materials PM1, PM2, the capacity to absorb magnetic fields decreases in the magnetic shield materials PM1, PM2 due to an effect of the through-hole. Namely, since a part of the respective magnetic shield materials PM1, PM2 is removed by forming the through-hole, the magnetic field characteristics of the magnetic shield materials PM1, PM2 will degrade. In contrast, it has been confirmed that even if the dimples DPL1, DPL2 are formed in the surfaces of the magnetic shield materials PM1, PM2 as with the present embodiment 2, there is almost no effect on the magnetic field characteristic. From such a reason, in the present embodiment 2, the dimples DPL1, DPL2 are formed in the surfaces of the magnetic shield materials PM1, PM2. Thus, according to the present embodiment 2, the magnetic shielding characteristic similar to that of the above-described embodiment 1 can be achieved, and a further improvement in the reliability of the package can be achieved.

Furthermore, in the present embodiment 2, since wet etching using an etchant is used as the method of forming the singulated magnetic shield materials PM1, PM2, a degradation in the magnetic field characteristics of the magnetic shield materials PM1, PM2 due to a stress can be prevented. For example, punching by a press can be used in singulating the magnetic shield materials PM1, PM2, but if the magnetic shield materials PM1, PM2 are formed by punching by a press, the magnetic shield materials PM1, PM2 are stressed when being punched, which in turn degrades the magnetic field characteristics of the magnetic shield materials PM1, PM2. In contrast, when singulating the magnetic shield materials PM1, PM2 by etching as with the present embodiment 2, the magnetic shield materials PM1, PM2 will not be stressed because etching is a chemical treatment. For this reason, if the magnetic shield materials PM1, PM2 are singulated by etching, a degradation of the magnetic field characteristic can be prevented. As a result, an excellent magnetic shield effect can be achieved.

Figure 33:
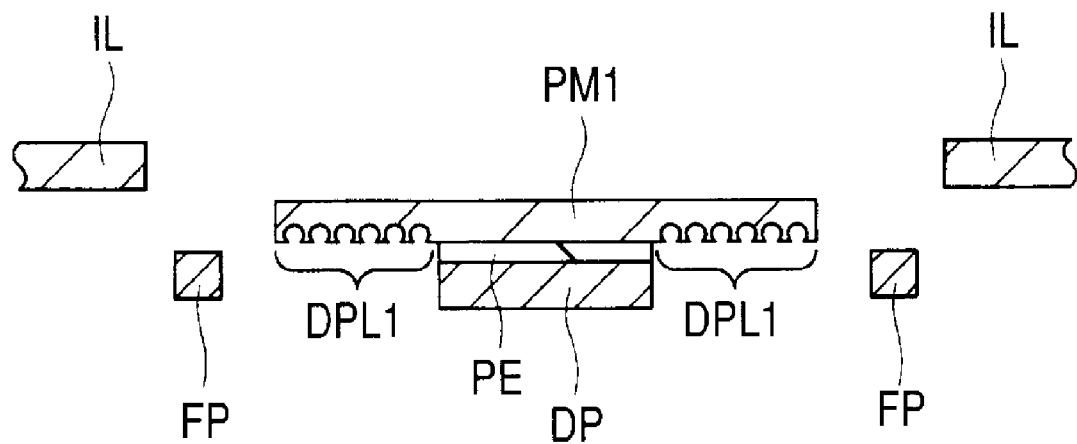
FIG. 33 is a cross sectional view showing a manufacturing process of the semiconductor device in the embodiment 2.

A process for manufacturing a package (semiconductor device) using the magnetic shield materials PM1, PM2 thus formed will be described. As shown in FIG. 33, a lead frame including the die pad DP, the frame FP, and the inner lead IL is prepared, and the magnetic shield material PM1 is mounted over the die pad DP of this lead frame via a paste PE. At this time, the magnetic shield material PM1 is disposed so that the region where the dimple DPL1 is not formed may be bonded to the die pad DP via the paste PE. Furthermore, the magnetic shield material PM1 is disposed so that the dimples DPL1 formed in the magnetic shield material PM1 may be in the rear surface.

Figure 34:
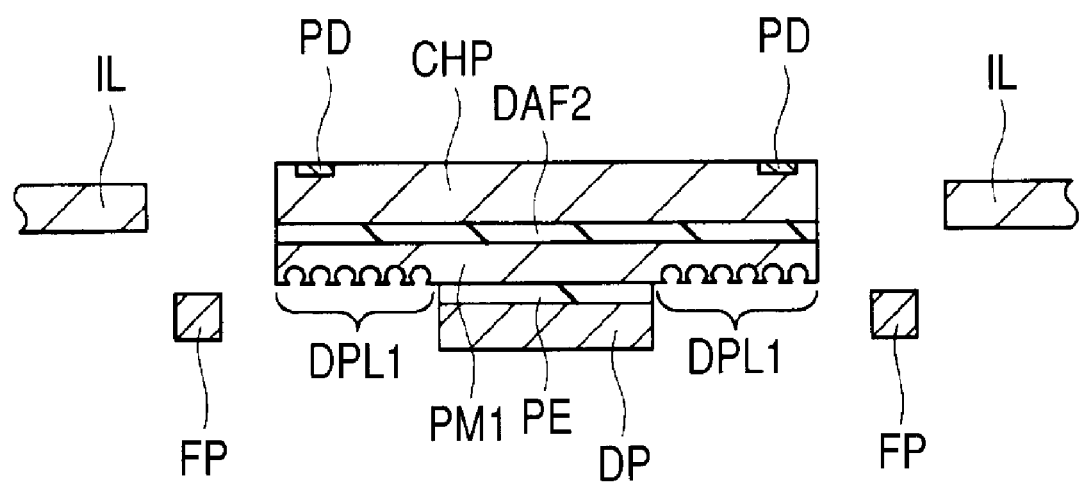
FIG. 34 is a cross sectional view showing a manufacturing process of the semiconductor device following the manufacturing process of FIG. 33.

Subsequently, as shown in FIG. 34, the semiconductor chip CHP is mounted over the magnetic shield material PM1. The die attach film DAF2 is stuck to the rear surface of the semiconductor chip CHP in advance, and the magnetic shield material PM1 and the semiconductor chip CHP are bonded to each other via the die attach film DAF2.

Figure 35:
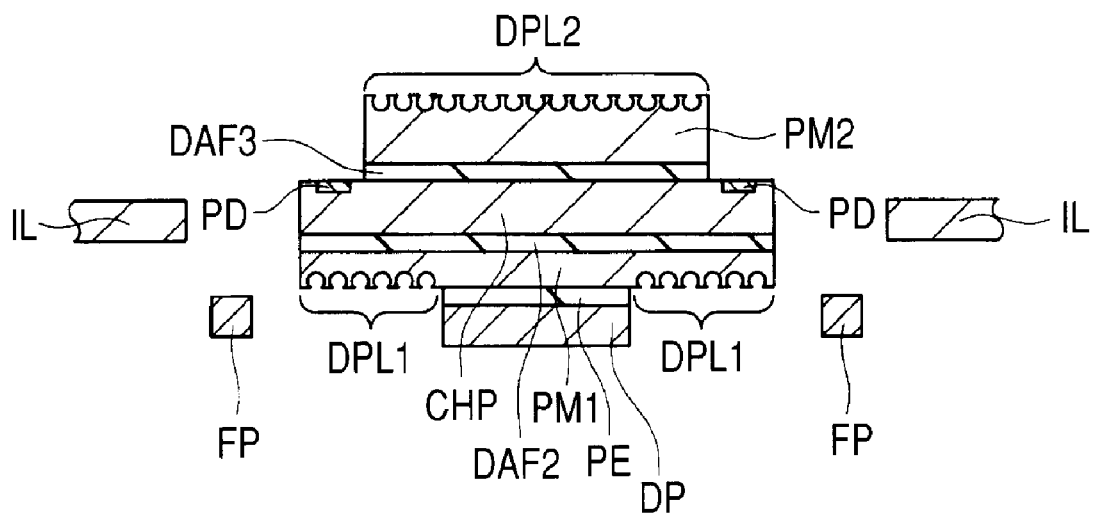
FIG. 35 is a cross sectional view showing a manufacturing process of the semiconductor device following the manufacturing process of FIG. 34.

Then, as shown in FIG. 35, the magnetic shield material PM2 is disposed over the semiconductor chip CHP. At this time, a die attach film DAF3 is already stuck to the rear surface of the magnetic shield material PM2, and the magnetic shield material PM2 is mounted over the principal surface of the semiconductor chip CHP via the die attach film DAF3. A plurality of dimples DPL2 is formed in the surface of the magnetic shield material PM2. The magnetic shield material PM2 is formed in such a size that the magnetic shield material PM2 may not be disposed over the pad PD formed in the principal surface of the semiconductor chip CHP. That is, while the area of the magnetic shield material PM2 is formed smaller than the size of the semiconductor chip CHP or the size of the magnetic shield material PM1, the thickness of the magnetic shield material PM2 is formed thicker than that of the magnetic shield material PM1.

Figure 36:
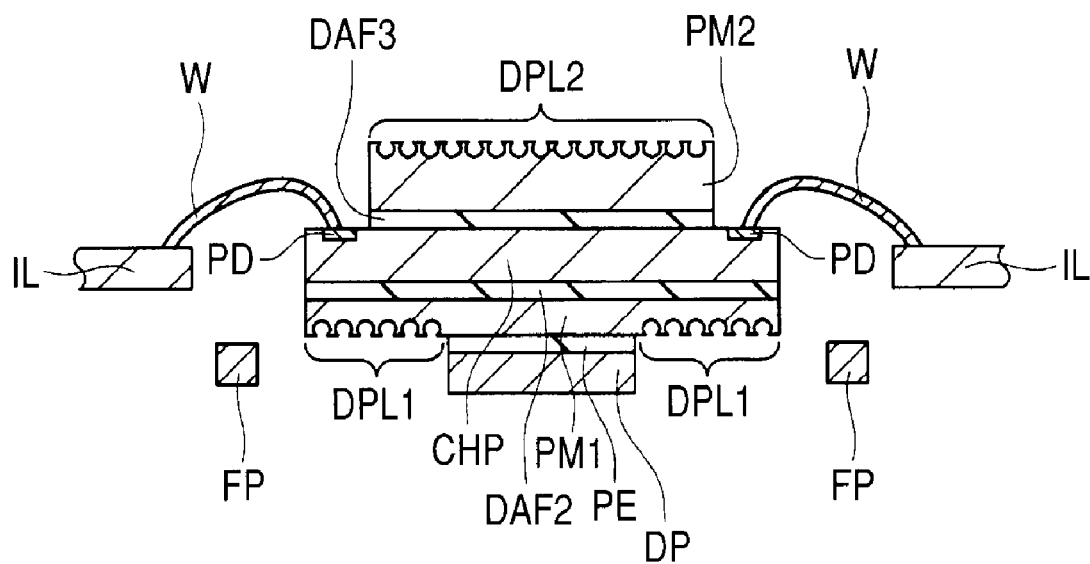
FIG. 36 is a cross sectional view showing a manufacturing process of the semiconductor device following the manufacturing process of FIG. 35.
Figure 37:
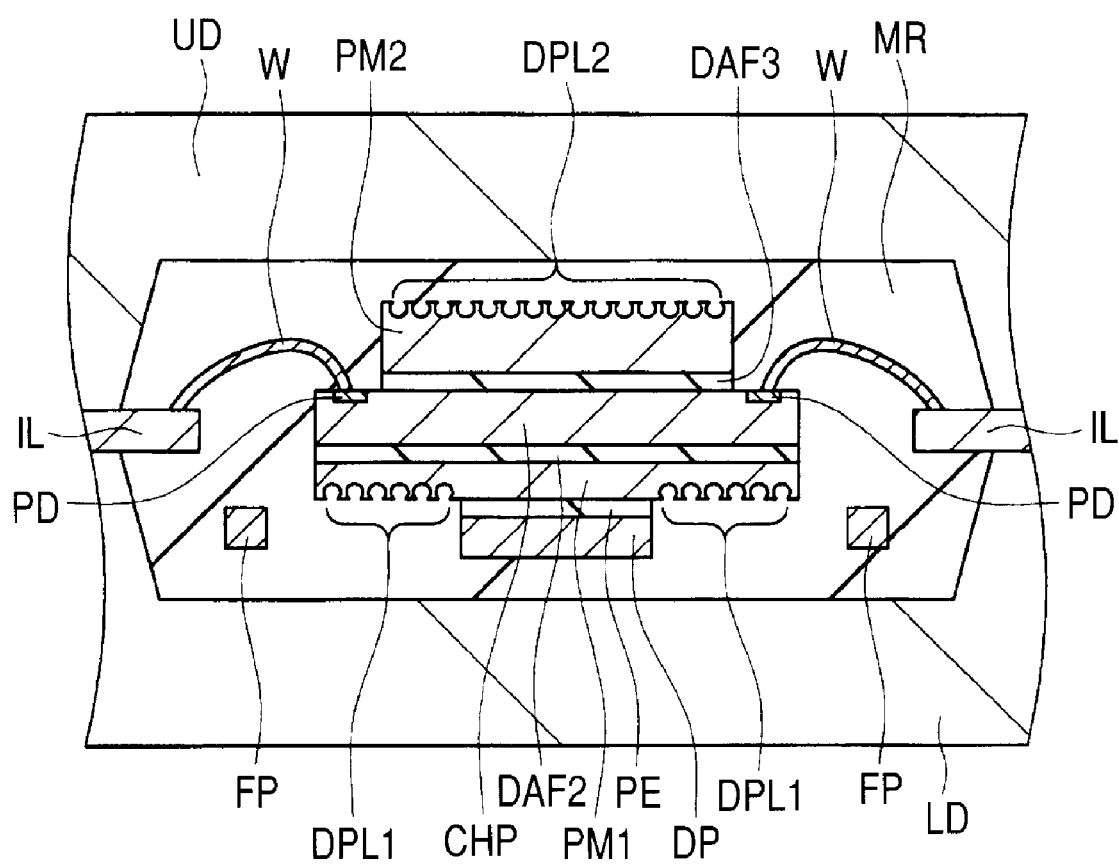
FIG. 37 is a cross sectional view showing a manufacturing process of the semiconductor device following the manufacturing process of FIG. 36.

Next, as shown in FIG. 36, the pad PD formed over the principal surface of the semiconductor chip CHP and the inner lead IL of the lead frame are electrically coupled to each other using the wire W (wire bonding). Subsequently, as shown in FIG. 37, the lead frame is sandwiched by the upper die UD and the lower die LD, and then a resin is injected therein so as to cover the semiconductor chip CHP, thereby forming the resin body MR. Specifically, the inner lead IL, the die pad DP, the wire W, the die attach films DAFT to DAF3, the magnetic shield materials PM1, PM2, and the semiconductor chip CHP are sealed with the resin body MR. At this time, since the resin body MR enters the insides of the dimples DPL1, DPL2, the contact area (surface area) between the resin body MR and the respective magnetic shield materials PM1, PM2 is secured sufficiently, and also the adhesive strength between the resin body MR and the respective magnetic shield materials PM1, PM2 will improve due to the anchor effect. In this manner, the package (semiconductor device) as shown in FIG. 28 can be manufactured.

Embodiment 3

Figure 38:
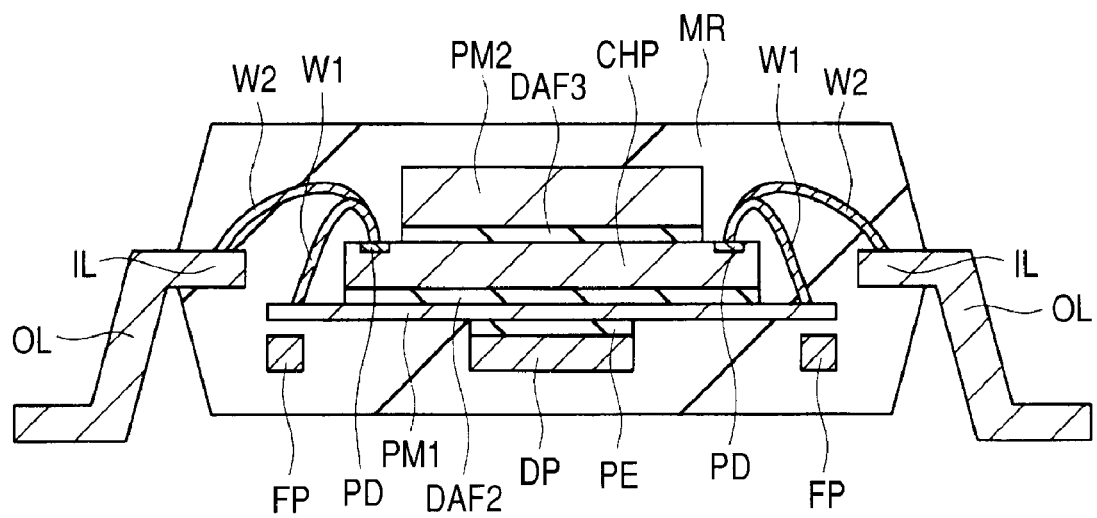
FIG. 38 is a cross sectional view showing a configuration of a semiconductor device in an embodiment 3.

A semiconductor device (package) in the present embodiment 3 will be described with reference to the accompanying drawings. FIG. 38 is a cross sectional view showing the configuration of a semiconductor device in the present embodiment 3. The configuration of the semiconductor device in the present embodiment 3 shown in FIG. 38 is almost the same as that of the semiconductor device in the above-described embodiment 1 shown in FIG. 6. That is, also in the present embodiment 3, the thickness of the magnetic shield material PM2 disposed over the principal surface of the semiconductor chip CHP is formed thicker than that of the magnetic shield material PM1 disposed in the rear surface of the semiconductor chip CHP, and the magnetic shield materials PM1, PM2 comprise permalloy. Thereby, the magnetic shield effect can be improved.

On the other hand, a difference between the present embodiment 3 and the above-described embodiment 1 is in that in the present embodiment 3, the area of the magnetic shield material PM1 disposed in the rear surface of the semiconductor chip CHP is larger than the area of the semiconductor chip CHP. This makes it possible to electrically couple from the pad PD of the semiconductor chip CHP to the magnetic shield material PM1 with a wire W1, in the present embodiment 3. Namely, in the present embodiment 3, in order to couple from the pad PD of the semiconductor chip CHP to GND (a reference potential), it is possible to couple to the magnetic shield material PM1 with the wire W1. In the present embodiment 3, the magnetic shield material PM1 serves to magnetically shield the semiconductor chip CHP from an external magnetic field, and additionally the magnetic shield material PM1 also serves as the GND for supplying a reference potential. On the other hand, the pad (signal pad) PD of the semiconductor chip CHP is electrically coupled to the inner lead IL with a wire W2.

In this manner, the present embodiment 3 is characterized in that the magnetic shield material PM1 is used also as a supply source of a reference potential. In particular, also in the present embodiment 3, the die pad DP is formed with a small tab, and it is therefore difficult to couple this small tab, as the supply source of a reference potential, to the semiconductor chip CHP. Then, in the present embodiment 3, by forming the magnetic shield material PM1, which is an alloy (permalloy) of nickel and iron, larger than the area of the semiconductor chip CHP, the magnetic shield material PM1 and the pad PD of the semiconductor chip CHP can be easily coupled to each other with the wire W1 and the die pad DP is utilized as the supply source of a reference potential. Furthermore, advantageously, the wire W1 can be disposed at any location of the magnetic shield material PM1 protruding from the semiconductor chip CHP. Furthermore, since it is possible to couple from the semiconductor chip CHP to the magnetic shield material PM1, which supplies a reference potential, with a plurality of wires, the stability of the reference potential can be improved. Note that the configuration according to the present embodiment 3 can be used simultaneously with the configuration for coupling a wire from the semiconductor chip CHP to the inner lead IL used for the reference potential. For example, in the present embodiment 3, as the pad PD of the semiconductor chip CHP, a plurality of pads PD used for the reference potential (fixed potential) is formed, wherein a first group of pads PD used for the reference potential is coupled to the inner lead IL and a second group of pads PD used for the reference potential is coupled to the magnetic shield material PM1.

Since the method of manufacturing a package (semiconductor device) in the present embodiment 3 is almost the same as that of manufacturing a package in the above-described embodiment 1, the description thereof is omitted.

Embodiment 4

Figure 39:
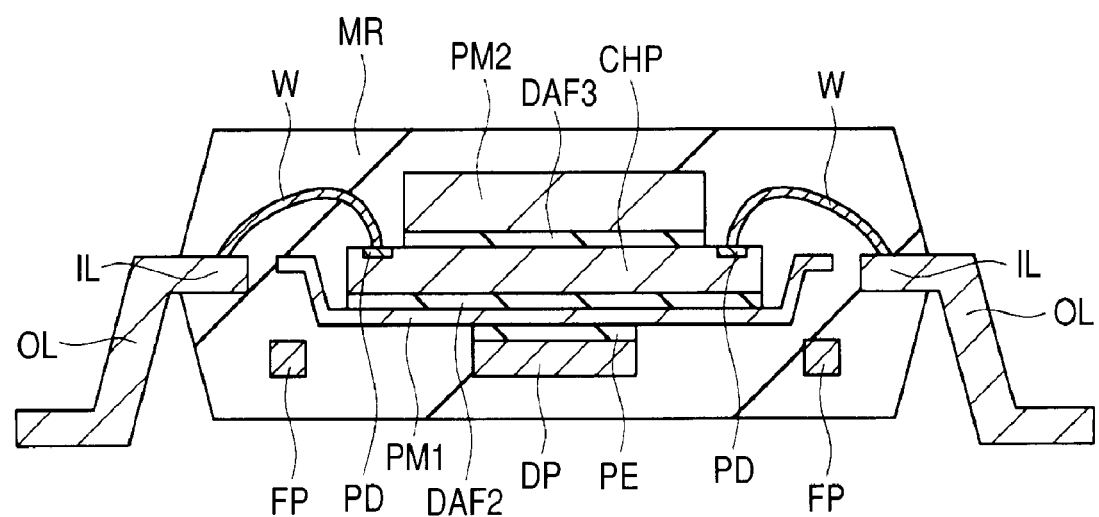
FIG. 39 is a cross sectional view showing a configuration of a semiconductor device in an embodiment 4.

A semiconductor device (package) in the present embodiment 4 will be described with reference to the accompanying drawings. FIG. 39 is a cross sectional view showing the configuration of a semiconductor device in the present embodiment 4. The configuration of the semiconductor device in the present embodiment 4 shown in FIG. 39 is almost the same as that of the semiconductor device in the above-described embodiment 1 shown in FIG. 6. That is, also in the present embodiment 4, the thickness of the magnetic shield material PM2 disposed over the principal surface of the semiconductor chip CHP is formed thicker than that of the magnetic shield material PM1 disposed in the rear surface of the semiconductor chip CHP, and the magnetic shield materials PM1, PM2 comprise permalloy. Thereby, the magnetic shield effect can be improved.

On the other hand, a difference between the present embodiment 4 and the above-described embodiment 1 is in that the area of the magnetic shield material PM1 disposed in the rear surface of the semiconductor chip CHP is larger than the area of the semiconductor chip CHP, and also that an end portion of the magnetic shield material PM1 is formed so as to be bent and cover the side face of the semiconductor chip CHP. Since the magnetic shield material PM1 is also disposed on the side face side of the semiconductor chip CHP in this manner, not only the upper and lower sides of the semiconductor chip CHP but the side face thereof can be covered with the magnetic shield material PM1. As a result, the magnetic shield material PM1 for absorbing an external magnetic field is also disposed on the side face side of the semiconductor chip CHP, and therefore the semiconductor chip CHP can be more effectively shielded from an external magnetic field.

Embodiment 5

Figure 40:
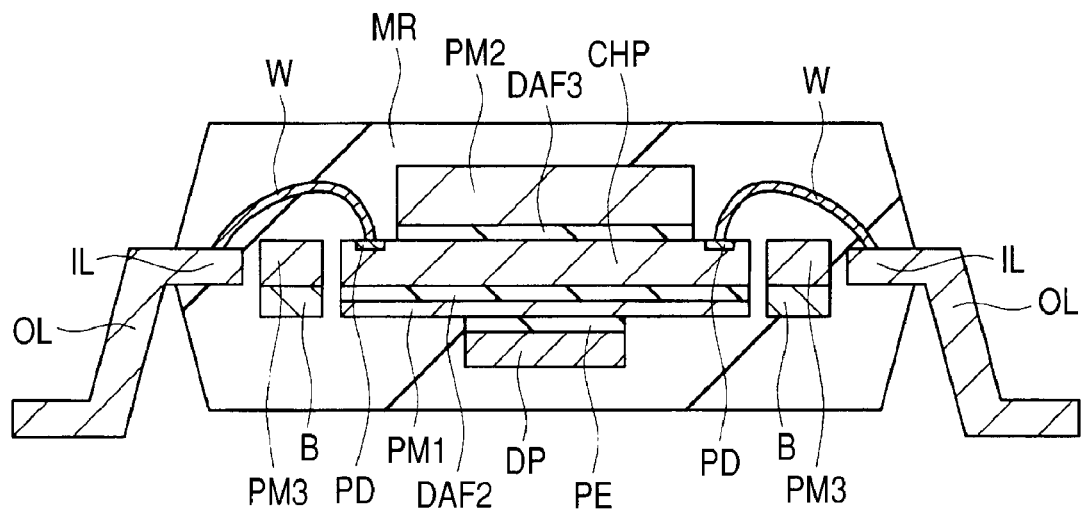
FIG. 40 is a cross sectional view showing a configuration of a semiconductor device in an embodiment 5.

A semiconductor device (package) in the present embodiment 5 will be described with reference to the accompanying drawings. FIG. 40 is a cross sectional view showing the configuration of a semiconductor device in the present embodiment 5. The configuration of the semiconductor device in the present embodiment 5 shown in FIG. 40 is almost the same as that of the semiconductor device in the above-described embodiment 1 shown in FIG. 6. That is, also in the present embodiment 5, the thickness of the magnetic shield material PM2 disposed over the principal surface of the semiconductor chip CHP is formed thicker than that of the magnetic shield material PM1 disposed in the rear surface of the semiconductor chip CHP, and the magnetic shield materials PM1, PM2 comprise permalloy. Thereby, the magnetic shield effect can be improved.

On the other hand, a difference between the present embodiment 5 and the above-described embodiment 1 is in that in the lead frame, a bus bar B for supplying a fixed potential is disposed between the die pad DP and the inner lead IL. Then, a magnetic shield material PM3 is disposed over the bus bar B. Thereby, the semiconductor chip CHP will be surrounded by the magnetic shields PM1, PM2, and in addition the side face thereof will be surrounded by the magnetic shield PM3. Accordingly, as with the above-described embodiment 4, the magnetic shield material PM3 is also disposed on the side face side of the semiconductor chip CHP, and thereby not only the upper and lower sides of the semiconductor chip CHP but the side face thereof can be covered with the magnetic shield material PM3. As a result, the magnetic shield material PM3 for absorbing an external magnetic field is also disposed on the side face side of the semiconductor chip CHP, and therefore the semiconductor chip CHP can be more effectively shielded from an external magnetic field.

Embodiment 6

Figure 41:
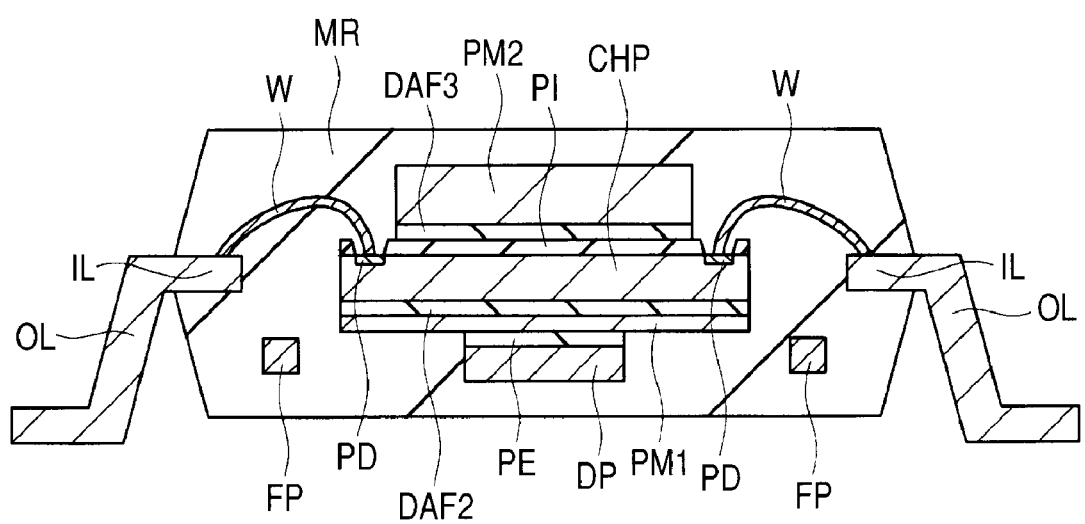
FIG. 41 is a cross sectional view showing a configuration of a semiconductor device in an embodiment 6.

A semiconductor device (package) in the present embodiment 6 will be described with reference to the accompanying drawings. FIG. 41 is a cross sectional view showing the configuration of a semiconductor device in the present embodiment 6. The configuration of the semiconductor device in the present embodiment 6 shown in FIG. 41 is almost the same as that of the semiconductor device in the above-described embodiment 1 shown in FIG. 6. That is, also in the present embodiment 6, the thickness of the magnetic shield material PM2 disposed over the principal surface of the semiconductor chip CHP is formed thicker than that of the magnetic shield material PM1 disposed in the rear surface of the semiconductor chip CHP, and the magnetic shield materials PM1, PM2 comprise permalloy. Thereby, the magnetic shield effect can be improved.

On the other hand, a difference between the present embodiment 6 and the above-described embodiment 1 is in that a polyimide film PI is formed in the principal surface of the semiconductor chip CHP. The polyimide film PI is a protection film, which is provided to protect the integrated circuits, such as the MRAM, formed on the principal surface side of the semiconductor chip CHP when bonding the magnetic shield material PM2 disposed over the semiconductor chip CHP. That is, in the present embodiment 6, since the magnetic shield material PM2 is laminated and formed over the principal surface of the semiconductor chip CHP, the protection film comprising the polyimide film. PI is provided to protect the principal surface of the semiconductor chip CHP. Usually, when members are laminated and disposed over the semiconductor chip CHP, the polyimide film PI is formed over the principal surface of the semiconductor chip CHP and the temperature at which the polyimide film PI is formed is typically around 300° C. to 350° C.

However, in the present embodiment 6, the MRAM is formed in the semiconductor chip CHP, and in view of the magnetic characteristic of the MRAM, the temperature at which the polyimide film PI is formed needs to be lower than the ordinary temperature of 300° C. to 350° C. Namely, in the present embodiment 6, since the MRAM is formed in the semiconductor chip CHP, the temperature at which the polyimide film PI is formed is set to around 260° C. or lower.

Thereby, the magnetic characteristic of the MRAM formed in the semiconductor chip CHP can be secured.

Figure 42:
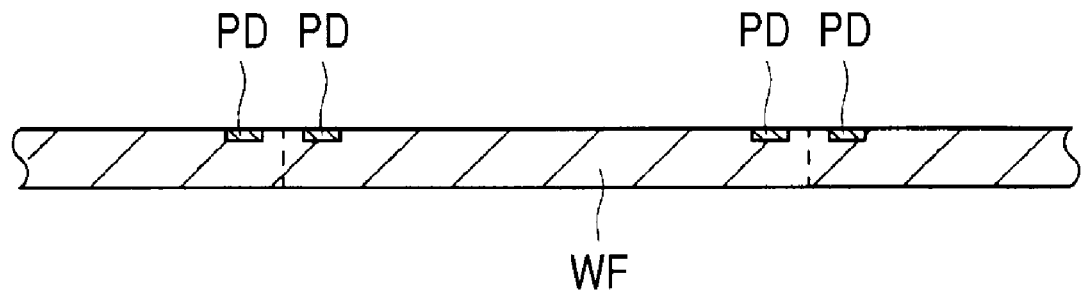
FIG. 42 is a cross sectional view showing a manufacturing process of the semiconductor device in the embodiment 6.

Hereinafter, a method of manufacturing a package (semiconductor device) in the present embodiment 6 will be described with reference to the accompanying drawings. As shown in FIG. 42, the semiconductor wafer WF is prepared. A plurality of chip areas is formed in the semiconductor wafer WF, and integrated circuits including the MRAM are formed in the individual chip area. FIG. 42 illustrates the pads PD formed in the individual chip area.

Figure 43:
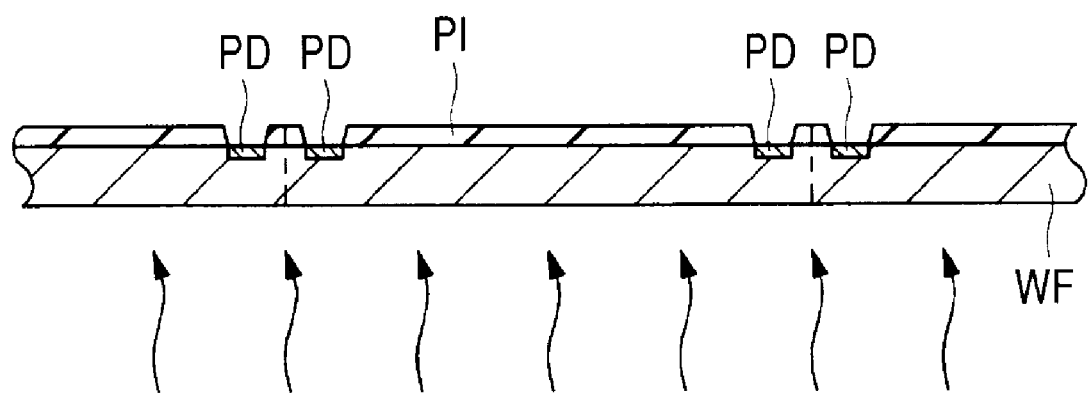
FIG. 43 is a cross sectional view showing a manufacturing process of the semiconductor device following the manufacturing process of FIG. 42.

Subsequently, as shown in FIG. 43, the polyimide film PI is formed over the semiconductor wafer WF. Specifically, the photosensitive polyimide film PI is applied over the semiconductor wafer WF while the semiconductor wafer WF is rotated. Then, patterning is performed on the applied photosensitive polyimide film PI using a photolithography technique. The patterning of the polyimide film PI is performed so as to open the region where the pad PD is formed. Then, cure is performed on the polyimide film PI. In the present embodiment 6, the temperature at which this cure is performed is lower than the ordinary temperature, and is 260° C. or lower. Thus, the cure can be performed on the polyimide film PI without affecting the magnetic characteristic of the MRAM formed in the individual chip area of the semiconductor wafer WF.

Figure 44:
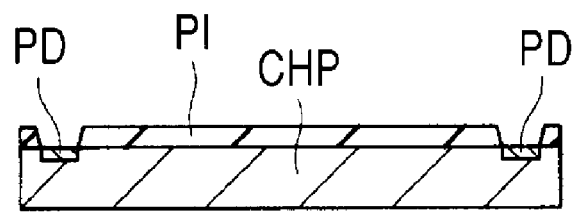
FIG. 44 is a cross sectional view showing a manufacturing process of the semiconductor device following the manufacturing process of FIG. 43.

Next, as shown in FIG. 44, the individual chip area is separated by dicing the semiconductor wafer WF, and thereby the semiconductor chip CHP is acquired. The polyimide film PI is formed over the principal surface of the semiconductor chip CHP.

Figure 45:
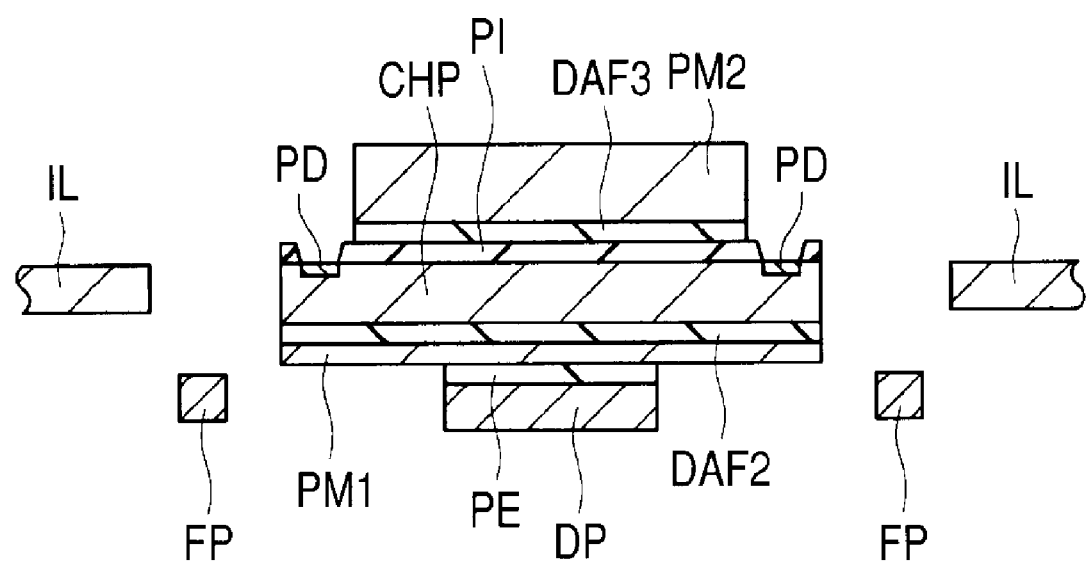
FIG. 45 is a cross sectional view showing a manufacturing process of the semiconductor device following the manufacturing process of FIG. 44.

Subsequently, as shown in FIG. 45, first, the magnetic shield material PM1 is mounted over the die pad DP constituting the lead frame via the paste PE. Then, the semiconductor chip CHP is mounted over the magnetic shield material PM1 via the die attach film DAF2. The die attach film DAF2 is stuck to the semiconductor chip CHP in advance, and the semiconductor chip CHP and the magnetic shield material PM1 are bonded to each other via the die attach film DAF2.

Next, the magnetic shield material PM2 is mounted over the semiconductor chip CHP. At this time, the die attach film DAF3 is already stuck to the rear surface of the magnetic shield material PM2, and the magnetic shield material PM2 is mounted over the principal surface of the semiconductor chip CHP via the die attach film DAF3. The magnetic shield material PM2 is formed in such a size that the magnetic shield material PM2 may not be disposed over the pad PD formed in the principal surface of the semiconductor chip CHP. That is, while the area of the magnetic shield material PM2 is formed smaller than the size of the semiconductor chip CHP or the size of the magnetic shield material PM1, the thickness of the magnetic shield material PM2 is formed thicker than that of the magnetic shield material PM1. Here, since the polyimide film PI is formed in the semiconductor chip CHP and the magnetic shield material PM2 is disposed via the die attach film DAF3 over the polyimide film PI, the principal surface of the semiconductor chip CHP is protected by the polyimide film PI even if the magnetic shield material PM2 is disposed over the semiconductor chip CHP.

Figure 46:
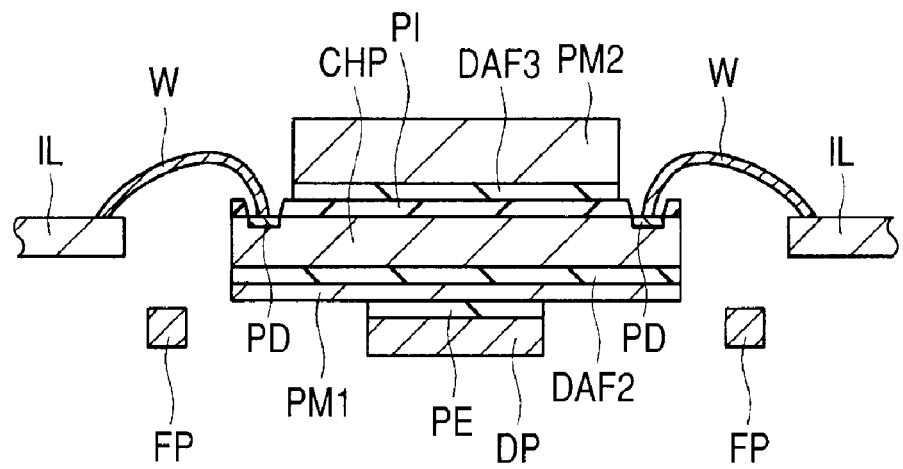
FIG. 46 is a cross sectional view showing a manufacturing process of the semiconductor device following the manufacturing process of FIG. 45.
Figure 47:
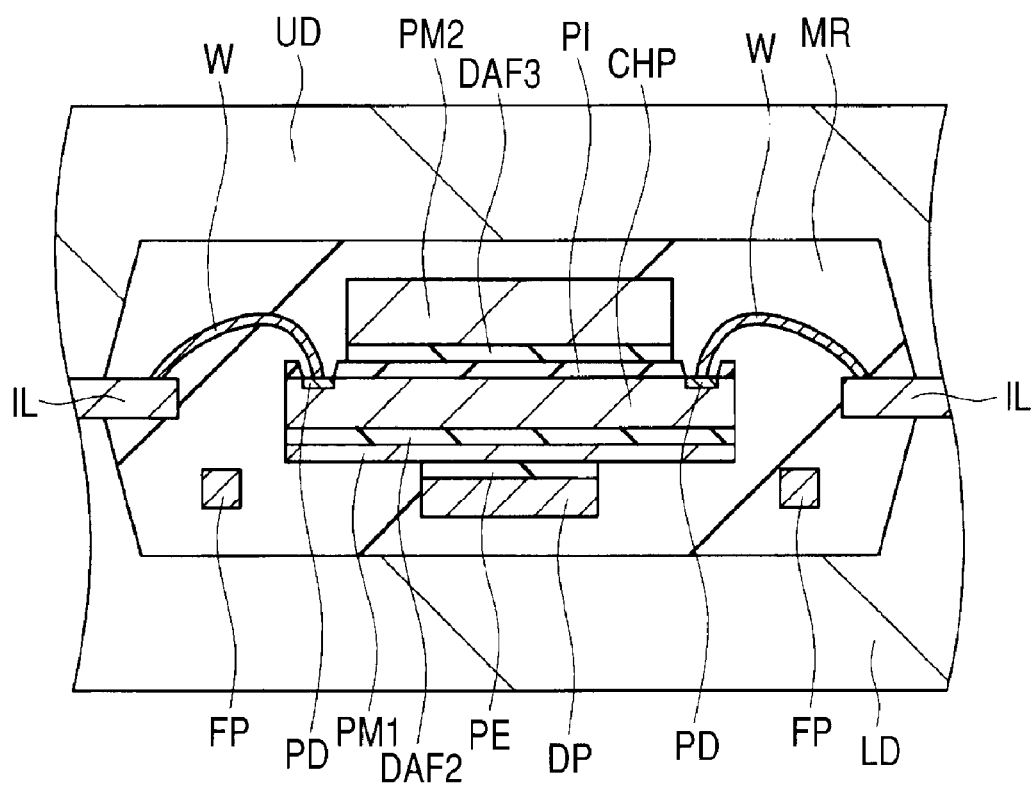
FIG. 47 is a cross sectional view showing a manufacturing process of the semiconductor device following the manufacturing process of FIG. 46.

Next, as shown in FIG. 46, the pad PD formed over the principal surface of the semiconductor chip CHP and the inner lead IL of the lead frame are electrically coupled to each other using the wire W (wire bonding). Subsequently, as shown in FIG. 47, the lead frame is sandwiched by the upper die UD and the lower die LD, and then a resin is injected therein so as to cover the semiconductor chip CHP, thereby forming the resin body MR. Specifically, the inner lead IL, the die pad DP, the wire W, the die attach films DAFT to DAF3, the magnetic shield materials PM1, PM2, and the semiconductor chip CHP are sealed with the resin body MR. In this manner, the package (semiconductor device) as shown in FIG. 41 can be manufactured.

As described above, the present invention made by the present inventor has been described specifically based on the embodiments, however, it is obvious that the present invention is not limited to the above-described embodiments and various modifications may be made without departing from the scope of the invention.

The present invention can be utilized broadly in the manufacturing industries for manufacturing semiconductor devices.

What is claimed is:

1. A semiconductor device, comprising:
(a) a die pad;
(b) a plurality of leads disposed around the die pad;
(c) a semiconductor chip having a principal surface and a rear surface opposite the principal surface, and including a plurality of magnetic memory elements and a plurality of bonding pads on the principal surface side, the semiconductor chip being disposed over the die pad;
(d) a first magnetic shield material formed of a metal plate and disposed between the die pad and the rear surface of the semiconductor chip;
(e) a second magnetic shield material formed of a metal plate and disposed over the principal surface of the semiconductor chip so as to cover a region where the magnetic memory elements are formed;
(f) a plurality of bonding wires for electrically coupling the bonding pads to the leads, respectively; and
(g) a resin body sealing a part of the respective leads, the bonding wires, the die pad, the semiconductor chip, the first magnetic shield material, and the second magnetic shield material,
wherein the area of the second magnetic shield material is smaller than the area of the principal surface of the semiconductor chip,
wherein the thickness of the second magnetic shield material is thicker than the thickness of the first magnetic shield material, and
wherein the area of the die pad is smaller than the area of the first magnetic shield material and smaller than the area of the semiconductor chip.

2. The semiconductor device according to claim 1,
wherein a plurality of dimples is formed in a surface of the second magnetic shield material.

3. The semiconductor device according to claim 1,
wherein a plurality of dimples is formed in a surface of the first magnetic shield material exposed from the die pad.

4. The semiconductor device according to claim 2,
wherein the dimples formed in the surface of the second magnetic shield material are formed by etching.

5. The semiconductor device according to claim 3,
wherein the dimples formed in the surface of the first magnetic shield material are formed by etching.

6. The semiconductor device according to claim 1,
wherein the first magnetic shield material and the second magnetic shield material are formed from an alloy of nickel and iron.

7. The semiconductor device according to claim 1,
wherein the area of the first magnetic shield material is formed larger than the area of the principal surface of the semiconductor chip.

8. The semiconductor device according to claim 1, wherein the area of the first magnetic shield material is formed to be the same as the area of the principal surface of the semiconductor chip.

9. The semiconductor device according to claim 1, wherein the bonding pads are disposed around the principal surface of the semiconductor chip, and
wherein the second magnetic shield material is disposed inside an area formed by the bonding pads.

10. The semiconductor device according to claim 1, wherein the area of the second magnetic shield material is smaller than the area of the first magnetic shield material.

11. The semiconductor device according to claim 1, wherein corner portions of the die pad are joined to respective suspension leads.

* * * * *